(12) United States Patent
Uchida

(10) Patent No.: US 10,276,470 B2
(45) Date of Patent: Apr. 30, 2019

(54) SEMICONDUCTOR DEVICE HAVING AN ELECTRIC FIELD RELAXATION STRUCTURE

(71) Applicant: Panasonic Intellectual Property Management Co., Ltd., Osaka (JP)

(72) Inventor: Masao Uchida, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 15 days.

(21) Appl. No.: 15/834,035

(22) Filed: Dec. 6, 2017

(65) Prior Publication Data
US 2018/0174938 A1    Jun. 21, 2018

(30) Foreign Application Priority Data

Dec. 19, 2016   (JP) ................... 2016-245590

(51) Int. Cl.
*H01L 23/00*    (2006.01)
*H01L 23/31*    (2006.01)
(Continued)

(52) U.S. Cl.
CPC ...... *H01L 23/3171* (2013.01); *H01L 29/0623* (2013.01); *H01L 29/1608* (2013.01); *H01L 23/3192* (2013.01); *H01L 23/562* (2013.01); *H01L 29/063* (2013.01); *H01L 29/7395* (2013.01); *H01L 29/7802* (2013.01); *H01L 29/872* (2013.01)

(58) Field of Classification Search
CPC ............... H01L 23/3171; H01L 23/562; H01L 29/0623; H01L 29/063; H01L 29/1608
See application file for complete search history.

(56) References Cited

U.S. PATENT DOCUMENTS 7,183,626 B2 * 2/2007 Ranjan .................. H01L 23/585
                                                                257/379
7,915,705 B2 * 3/2011 Yamamoto ............ H01L 29/063
                                                                257/492

(Continued)

FOREIGN PATENT DOCUMENTS

JP            2013-251407        12/2013

*Primary Examiner* — Ida M Soward
(74) *Attorney, Agent, or Firm* — McDermott Will & Emery LLP

(57) ABSTRACT

Semiconductor device 1000 includes semiconductor 102, an electric field relaxation structure, at least one surface electrode 112, passivation layer 114, and insulating layer 115. Semiconductor layer 102 has a predetermined element region. The electric field alleviation structure is disposed on semiconductor 102 at an end of the element region. On semiconductor 102, surface electrode 112 is disposed inside the electric field alleviation structure when viewed in a normal direction of semiconductor 102. Passivation layer 114 covers the electric field alleviation structure and a peripheral portion of at least one surface electrode 112, and has an opening portion above surface electrode 112. On surface electrode 112, insulating layer 115 is disposed inside opening portion 114*p* so as to be separated from passivation layer 114. When viewed in the normal direction of semiconductor 102, insulating layer 115 is disposed so as to surround partial region 112*a* of surface electrode 112.

15 Claims, 16 Drawing Sheets

(51) Int. Cl.
    *H01L 29/06*     (2006.01)
    *H01L 29/16*     (2006.01)
    *H01L 29/78*     (2006.01)
    *H01L 29/739*     (2006.01)
    *H01L 29/872*     (2006.01)

(56) References Cited

U.S. PATENT DOCUMENTS

| | | | |
|---|---|---|---|
| 8,716,826 B2* | 5/2014 | Kawano | H01L 29/0619 |
| | | | 257/484 |
| 9,129,939 B2* | 9/2015 | Imai | H01L 29/45 |
| 9,159,784 B2* | 10/2015 | Romano | H01L 29/66212 |
| 9,224,816 B2* | 12/2015 | Wada | H01L 29/0623 |
| 9,224,877 B2* | 12/2015 | Hiyoshi | H01L 29/872 |
| 9,455,326 B2* | 9/2016 | Kinoshita | H01L 29/475 |
| 9,536,942 B2* | 1/2017 | Kawakami | H01L 21/266 |
| 9,825,145 B2* | 11/2017 | Yoshikawa | H01L 29/6603 |
| 9,825,163 B2* | 11/2017 | Tamaki | H01L 29/7811 |
| 2008/0001159 A1* | 1/2008 | Ota | H01L 29/0623 |
| | | | 257/77 |
| 2009/0050899 A1* | 2/2009 | Ikeda | H01L 23/291 |
| | | | 257/77 |
| 2015/0060882 A1* | 3/2015 | Tarui | H01L 29/36 |
| | | | 257/77 |
| 2015/0115287 A1 | 4/2015 | Tsuji et al. | |
| 2015/0333127 A1* | 11/2015 | Morino | H01L 29/78 |
| | | | 257/77 |
| 2015/0357405 A1* | 12/2015 | Ueda | H01L 29/0619 |
| | | | 257/77 |
| 2016/0315203 A1* | 10/2016 | Uchida | H01L 29/872 |

* cited by examiner

SEMICONDUCTOR DEVICE HAVING AN ELECTRIC FIELD RELAXATION STRUCTURE

BACKGROUND

1. Technical Field

The present disclosure relates to a semiconductor device.

2. Description of the Related Art

Silicon carbide (SiC) is a semiconductor material having a greater band gap and greater hardness, compared with silicon (Si). SiC is applied to semiconductor devices such as switching elements and rectifying elements. A semiconductor device made of SiC can advantageously reduce a power loss, for example, compared with a semiconductor device made of Si.

Typical semiconductor devices made of SiC include metal-insulator-semiconductor field-effect transistors (MISFETs) and Schottky-barrier diodes (SBDs). Metal-oxide-semiconductor field-effect transistor (MOSFET) is one kind of MISFETs. Junction-barrier Schottky diode (JBS) is one kind of SBDs.

A semiconductor device made of SiC (hereinafter referred to as "SiC semiconductor device") includes a semiconductor substrate and a semiconductor layer. The semiconductor layer is made of SiC, and is disposed on a main face of the semiconductor substrate. Above the semiconductor layer, an electrode (hereinafter referred to as "surface electrode") is disposed for electrical external coupling. At (or around) a terminal of the SiC semiconductor device, a termination structure is provided on the semiconductor layer that alleviates an electric field. A surface of the SiC semiconductor device is normally covered with a protective film (passivation film). The protective film has an opening portion from which a part of the surface electrode is exposed (see PTL 1). The part of the surface electrode exposed from the protective film can be used for electrical external coupling.

CITATION LIST

Patent Literature

PTL 1: Unexamined Japanese Patent Publication No. 2013-251407

SUMMARY

A highly reliable semiconductor device has been demanded for use in a hot, high-voltage environment.

In a conventional SiC semiconductor device disclosed in PTL 1, however, a protective film covering a termination structure may degrade, and thus its reliability may lower. Details will be described later. A similar problem can arise in an element made of another semiconductor than SiC.

One aspect of the present disclosure provides a highly reliable semiconductor device.

The one aspect of the present disclosure includes a semiconductor device described below. The semiconductor device includes a semiconductor, an electric field relaxation structure, at least one surface electrode, a passivation layer, and an insulating layer. The semiconductor has a predetermined element region. The electric field alleviation structure is disposed on the semiconductor at an end of the predetermined element region. On the semiconductor, the surface electrode is disposed inside the electric field alleviation structure when viewed in a normal direction of the semiconductor. The passivation layer covers the electric field alleviation structure and a peripheral portion of the at least one surface electrode, and has an opening portion above the surface electrode. On the surface electrode, the insulating layer is disposed inside the opening portion so as to be separated from the passivation layer. When viewed in the normal direction of the semiconductor, the insulating layer is disposed so as to surround a partial region of the surface electrode.

According to the one aspect of the present disclosure, a highly reliable semiconductor device is provided.

DETAILED DESCRIPTION

Figure 1A:
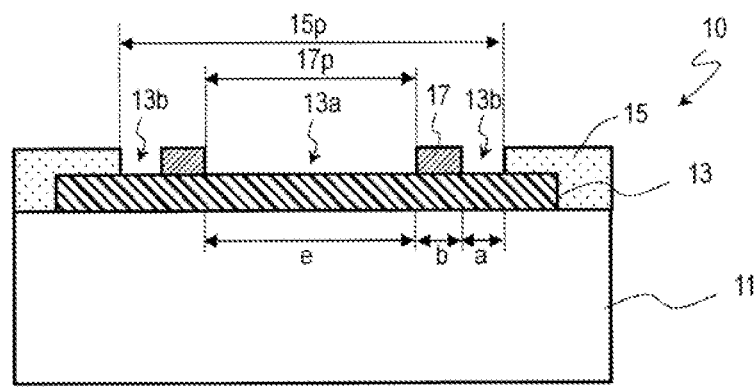
FIG. 1A is a cross-sectional view schematically illustrating an example of semiconductor device 10 according to a first exemplary embodiment.

Knowledge that has leaded the present disclosure will now be described herein with reference to a vertical semiconductor device as an example.

In a semiconductor device made of SiC, a large current flows in a direction perpendicular to a semiconductor substrate for switching or rectification with the large current, for example. In other words, a current flows from a front face of the semiconductor device, via a semiconductor layer and the semiconductor substrate in order, to a back face of the semiconductor device, or from the back face of the semiconductor device, via the semiconductor substrate and the SiC semiconductor layer in order, to the front face of the semiconductor device. Electrodes are provided on the front face and the back face of the semiconductor device for this purpose. This specification refers to such an electrode provided on a surface on a side, at which a semiconductor layer is present, of a semiconductor device for electrical external coupling as "surface electrode". Similarly, this specification refers to such an electrode provided on a surface on a side, at which a semiconductor substrate is present, of the semiconductor device, i.e., a surface opposite to the surface on the side, at which the semiconductor layer is formed on the semiconductor substrate, for electrical external coupling as "back face electrode". An SBD includes an anode as a surface electrode, and a cathode as a back face electrode, for example. An MISFET includes a source and a gate as a surface electrode, and a drain as a back face electrode, for example.

As described above, on a surface of a semiconductor device, a passivation layer is formed to protect a termination structure. The passivation layer normally covers a peripheral portion of a surface electrode (e.g., an anode and a source), and has an opening portion from which a part of the surface electrode is exposed.

After some investigations, the inventor of the present disclosure has found that a passivation layer is likely to degrade in its performance in a production process, an inspection process, and other processes for semiconductor devices, or after the semiconductor devices are produced. This can reduce reliability of the semiconductor devices.

For example, in an inspection process for semiconductor devices such as MISFETs and SBDs, an electrical signal is applied to each surface electrode via a probe, for example, to determine whether the semiconductor devices are acceptable. Continuity and breakdown voltages are thus checked between a plurality of electrodes provided on each of the semiconductor devices. In an SBD, continuity between an anode and a cathode is checked. In an MOSFET, continuity between a source and a drain is checked, as well as a breakdown voltage between a gate and the source is checked. At this time, the probe may not come into contact with an exposed part of a surface electrode correctly, and may damage a side face of a passivation layer covering a peripheral portion of the surface electrode. As a result, the passivation layer may be degraded, cracked, or peeled off, for example, and thus long-term reliability of the semiconductor device may be impaired. A semiconductor device made of a wide band gap semiconductor such as SiC, which is supposed to allow a large current to flow, may be applied with a plurality of probes on a single surface electrode in an inspection process to allow a large current to flow. Therefore the above-described problem, if present, can be significant.

In an assembly process represented by resin sealing, for example, a metal wire or a metal plate such as a bus bar may directly be coupled to a surface electrode to exchange electrical signals between inside and outside the resin. A surface of a passivation layer may at this time be damaged by the wire, for example, and thus a problem similar to the above-described problem can arise.

A wire or a bus bar, for example, may indirectly be coupled to a surface electrode. For example, in order to secure enough contact with an external electrode such as a bus bar, forming a relatively thicker metal film on a surface electrode through plating has been proposed. The metal film will be selectively disposed on the surface electrode. The metal film may be formed on the surface electrode before or after an inspection process. When the metal film is to be formed after the inspection process, a probe mark may be generated on a surface electrode through the inspection process, and the probe mark may cause the metal film to crack. When the metal film is formed before the inspection process, the metal film may also be cracked when a metal wire or a bus bar, for example, is allowed to come into contact with an upper face of the metal film. The metal film may also be cracked when the semiconductor device is operated, depending on whether a large current is applied to the semiconductor device, or depending on an operating environment stressed by a higher or lower temperature, for example. If the metal film is cracked, the crack can extend in a long period of time, and thus can reach a passivation layer. Therefore, the passivation layer may be degraded, cracked, or peeled off, for example, and thus long-term reliability of the semiconductor device may be impaired.

As a result of investigation based on the above-described knowledge, the inventor of the present disclosure has found that a passivation layer covering a peripheral portion of a surface electrode can be prevented from degrading as much as possible by newly adding an insulating layer inside an opening portion of the passivation layer. Specifically, by adding the insulating layer, a contact region of a surface electrode, at which a probe is allowed to come into contact with during an inspection process, can be limited to a region surrounded by the insulating layer. Therefore, the probe is less likely to directly come into contact with the passivation layer. Even if the probe comes into contact with the insulating layer, the passivation layer lying outside the insulating layer is less likely to be affected. Even if the metal film is disposed on the surface electrode, and is cracked, the crack can be prevented as much as possible from extending to the passivation layer. Decrease in function of the passivation layer can thus be suppressed, and accordingly long-term reliability of the semiconductor device can be improved.

Outline of one aspect of the present disclosure is as follows.

A semiconductor device according to the one aspect of the present disclosure includes a semiconductor, an electric field relaxation structure, at least one surface electrode, a passivation layer, and an insulating layer. The semiconductor has a predetermined element region. The electric field alleviation structure is disposed on the semiconductor at an end of the predetermined element region. On the semiconductor, the surface electrode is disposed inside the electric field alleviation structure when viewed in a normal direction of the semiconductor. The passivation layer covers the electric field alleviation structure and a peripheral portion of the at least one surface electrode, and has an opening portion above the at least one surface electrode. On the at least one surface electrode, the insulating layer is disposed inside the opening portion so as to be separated from the passivation layer. When viewed in the normal direction of the semiconductor, the insulating layer is disposed so as to surround a partial region of the surface electrode.

The passivation layer and the insulating layer may be made of a single material, for example.

In an exemplary embodiment, the semiconductor device is a diode, and the at least one surface electrode includes at least either of a cathode and an anode.

In another exemplary embodiment, the semiconductor device is a transistor, and the at least one surface electrode includes at least either of a source and a drain.

In still another exemplary embodiment, the semiconductor device is a transistor, and the at least one surface electrode includes at least either of an emitter and a collector.

In still another exemplary embodiment, the semiconductor device is a transistor, and the at least one surface electrode includes a gate.

In still another exemplary embodiment, the at least one surface electrode includes an electrode provided outside a main current path.

The semiconductor device may further include, for example, a metal layer disposed on a region of the at least one surface electrode, which is covered with neither the passivation layer nor the insulating layer.

The at least one surface electrode may include a first region and a second region, for example. When viewed in the normal direction of the semiconductor, the first region is surrounded by the insulating layer, and the second region is disposed between the passivation layer and the insulating layer. The metal layer may include a first portion and a second portion, for example. The first portion lies on the first region. The second portion lies on the second region.

The first portion and the second portion of the metal layer may be separated from each other, for example.

The metal layer may abut a side face of the passivation layer and a side face of the insulating layer, for example.

The metal layer may have hardness greater than hardness of the at least one surface electrode, for example.

The at least one surface electrode may mainly contain aluminum, for example. The metal layer may mainly contain nickel, for example.

The semiconductor may contain silicon carbide, for example.

First Exemplary Embodiment

A semiconductor device according to a first exemplary embodiment of the present disclosure will now be described herein with reference to the accompanying drawings. This exemplary embodiment describes, but not limited to, an example where a first conductivity type is n-type, and a second conductivity type is p-type. In an exemplary embodiment of the present disclosure, the first conductivity type may be p-type, and the second conductivity type may be n-type.

Figure 1B:
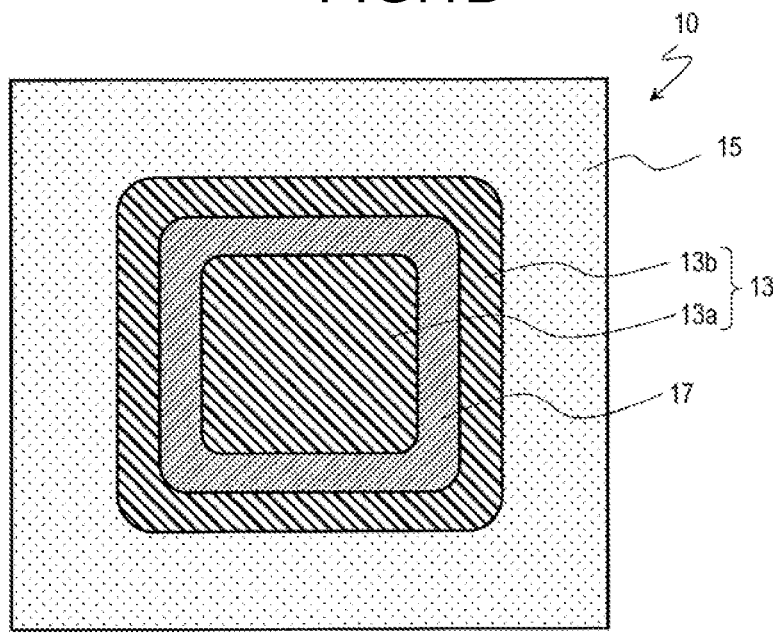
FIG. 1B is a top view schematically illustrating the example of semiconductor device 10 according to the first exemplary embodiment.

FIGS. 1A and 1B respectively are a cross-sectional view and a top view schematically illustrating semiconductor device 10 according to the first exemplary embodiment.

Semiconductor device 10 according to this exemplary embodiment includes semiconductor 11, surface electrode 13, passivation layer 15, and insulating layer 17. Semiconductor 11 has a predetermined element region.

Semiconductor 11 may be a semiconductor layer disposed on a substrate such as a semiconductor substrate, or may be a substrate such as a silicon substrate. Although not illustrated in the figures, at an end of the element region, semiconductor 11 is disposed with an electric field relaxation structure. This specification refers to the "element region" as a region of a semiconductor wafer, which is surrounded by a scribe line, and as a region corresponding to a semiconductor chip when the region is cut out. When the region is cut out, a part of the scribe line may remain on the semiconductor chip. In this example, the element region has a rectangular shape when viewed in a normal direction. However, a shape of the element region is not limited to the rectangular shape.

Surface electrode 13 is disposed on semiconductor 11. When viewed in the normal direction of the semiconductor 11, surface electrode 13 lies inside an outermost periphery of the electric field alleviation structure. In this example, surface electrode 13 abuts semiconductor 11. However, surface electrode 13 may not abut semiconductor 11. A plurality of surface electrodes 13 separated from each other may be provided on single semiconductor device 10.

Passivation layer 15 is disposed on semiconductor 11. Passivation layer 15 covers the electric field alleviation structure formed on semiconductor 11 and a peripheral portion of surface electrode 13. Passivation layer 15 has first opening portion 15p above surface electrode 13.

On surface electrode 13, insulating layer 17 is disposed inside first opening portion 15p so as to be separated from passivation layer 15. It is preferable that insulating layer 17 should not abut (be fully separated from) passivation layer 15. However, a part of insulating layer 17 may abut passivation layer 15. When viewed in the normal direction of semiconductor 11, insulating layer 17 is disposed so as to surround partial region 13a of surface electrode 13. This specification refers to region 13a of surface electrode 13, which is surrounded by insulating layer 17, as "first region," and region 13b of surface electrode 13, which lies between passivation layer 15 and insulating layer 17, as "second region". In this example, on surface electrode 13, insulating layer 17 has an annular pattern having second opening portion 17p, where first region 13a of surface electrode 13 is exposed through second opening portion 17p. An expression "disposed so as to surround first region 13a" includes a case when first region 13a is approximately surrounded by insulating layer 17. First region 13a may be fully surrounded by insulating layer 17. For example, insulating layer 17 may be formed with a plurality of patterns arranged so as to surround first region 13a. Insulating layer 17 may not be disposed fully around first region 13a, but may be disposed in a c-shape, for example.

Passivation layer 15 and insulating layer 17 may be made of a single insulation film. In other words, passivation layer 15 and insulating layer 17 may contain a single material, and may be formed in a single layer.

Figure 1C:
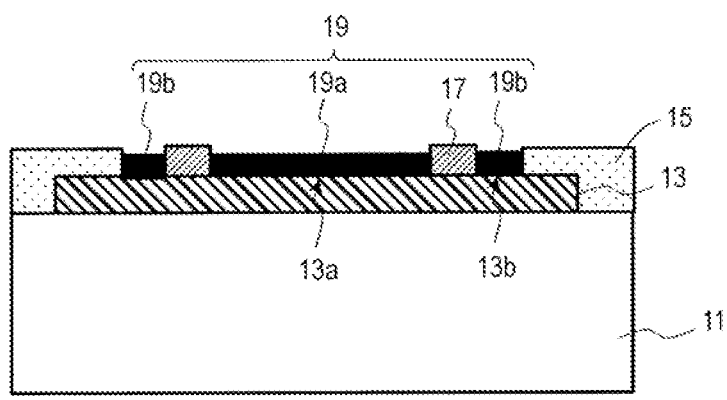
FIG. 1C is a cross-sectional view schematically illustrating an example of another semiconductor device according to the first exemplary embodiment.

FIG. 1C is a cross-sectional view of a modified example of semiconductor device 10. As shown in FIG. 1C, metal layer 19 may be disposed on regions of surface electrode 13, in which neither passivation layer 15 nor insulating layer 17 is formed. Surface electrode 13 can therefore electrically be coupled to a metal conductor, such as a metal wire and a bus bar, via metal layer 19. Metal layer 19 can be well coupled to the metal conductor through soldering, for example, and thus can reduce electric resistance between surface electrode 13 and the metal conductor.

In this example, metal layer 19 is disposed on first region 13a and second region 13b of surface electrode 13. The metal layer is not disposed on passivation layer 15 and insulating layer 17. In other words, upper faces of passivation layer 15 and insulating layer 17 are exposed from the metal layer. This specification refers to portion 19a disposed on first region 13a of surface electrode 13 in metal layer 19 as "first portion", and portion 19b disposed on second region 13b as "second portion". Metal layer 19 may abut side faces of insulating layer 17 and passivation layer 15. In here, first portion 19a of metal layer 19 abuts a side face, which faces second opening portion 17p, of insulating layer 17. Second portion 19b of metal layer 19 abuts a side face, which faces first opening portion 15p, of passivation layer 15, and a side face, which faces passivation layer 15, of insulating layer 17. Metal layer 19 may be disposed away from passivation layer 15 or insulating layer 17.

According to this exemplary embodiment, by disposing insulating layer 17 on surface electrode 13, i.e., inside the opening portion of passivation layer 15, insulating layer 17 can be used as a guide when a probe is disposed in an inspection process. A contact region of a surface electrode, at which the probe is allowed to come into contact with, is thus limited to first region 13a lying inside insulating layer 17. The probe is therefore less likely to directly come into contact with passivation layer 15. Even if the probe comes into contact with insulating layer 17, passivation layer 15 can be less likely to be affected. Even if first portion 19a of metal layer 19 cracks from a probe mark on first region 13a, which is caused when the probe comes into contact with, the crack does not extend to second portion 19b, and a performance of insulating layer 17 is thus less likely to be affected. These effects will be described later with reference to the drawings.

First portion 19a and second portion 19b may be separated by insulating layer 17, or may be partially coupled to each other. When first portion 19a and second portion 19b are separated from each other, even if a crack occurs on first portion 19a, allowing the crack to extend, via second portion 19b, to passivation layer 15 can effectively be suppressed.

Metal layer 19 may include at least first portion 19a, and no metal layer may be disposed on second region 13b of surface electrode 13. Even in this case, the above-described effects can be obtained since passivation layer 15 is separated from insulating layer 17 and first portion 19a of the metal layer.

Metal layer 19 may have hardness greater than hardness of surface electrode 13. In this case, metal layer 19 can be likely to crack. However, metal layer 19 is separated by insulating layer 17, and thus, if a crack occurs, the crack is less likely to extend to passivation layer 15. The crack would be less likely to affect passivation layer 15 for its performance, and therefore long-term reliability of semiconductor device 10 can securely be achieved. For example, surface electrode 13 may mainly contain aluminum, and metal layer 19 may mainly contain nickel. An industrially established, cost effective production process can be utilized to form semiconductor device 10.

It is preferable that gap a between passivation layer 15 and insulating layer 17 be 1 μm or wider, for example. When gap a is 1 μm or wider, decrease in performance of passivation layer 15 can effectively be suppressed, even if metal layer 19 is damaged or cracked when a probe comes into contact with. It is preferable that gap a be 5 μm or wider. On the other hand, an upper limit for gap a is, but not limited to, 500 μm or narrower, for example. Then First region 13a can securely have an enough region, with which a probe is allowed to come into contact. It is preferable that width b of insulating layer 17 should fall within a range from 5 μm to 500 μm inclusive, for example. When width b is 5 μm or wider, decrease in performance of passivation layer 15 can further effectively be suppressed, even if metal layer 19 is damaged or cracked when a probe comes into contact with. On the other hand, when width b is 500 μm or narrower, first region 13a can securely have an enough region, with which a probe is allowed to come into contact. Width b of insulating layer 17, a thickness of insulating layer 17, a thickness of passivation layer 15, and a thickness of metal layer 19 are not particularly limited. As illustrated in the figures, passivation layer 15 and insulating layer 17 may be thicker than metal layer 19. Also, metal layer 19 may be thicker than passivation layer 15 and insulating layer 17. In such a case, it is preferable that first portion 19a and second portion 19b of metal layer 19 be set so as not to come into contact with each other above insulating layer 17. As an example, the thickness and width b of insulating layer 17 and the thickness of metal layer 19 may be set such that a value of width b of insulating layer 17 is equal to or larger than a value obtained through a calculation of (thickness of metal layer 19–thickness of insulating layer 17)×2. The thickness of insulating layer 17 may fall within a range from 0.3 μm to 10 μm inclusive, for example. The thickness of metal layer 19 may fall within a range from 1 μm to 50 μm inclusive, for example, and may fall within a range from 1 μm to 10 μm inclusive, for example, when metal layer 19 is formed through metal plating. Width e of first region 13a is not particularly limited, but can vary depending on a size of surface electrode 13, for example. When a wire is allowed to come into contact with first region 13a in an inspection process, a size of first region 13a may be 50 μm×50 μm or greater, for example. When a bus bar is allowed to come into contact with first region 13a, the size of first region 13a may be 1 mm×1 mm or greater, for example.

Semiconductor 11 may contain silicon carbide (SiC). A low loss, high breakdown-voltage power semiconductor device can thus be achieved, compared with a conventional semiconductor device made of silicon (Si). Semiconductor 11 may contain another wide band gap semiconductor, such as gallium nitride (GaN) and aluminum nitride (AlN), or may contain silicon.

Semiconductor device 10 may be, but not limited to, a bipolar transistor such as an insulated gate bipolar transistor (IGBT), a field effect transistor such as an MISFET, or a Schottky barrier diode, for example. Semiconductor device 10 may be a vertical type or a lateral type. When semiconductor device 10 is a diode, surface electrode 13 can be a cathode or an anode. When semiconductor device 10 is a field effect transistor, surface electrode 13 can be a source or a drain. When semiconductor device 10 is a bipolar transistor, surface electrode 13 can be an emitter or a collector.

Surface electrode 13 may be an electrode provided outside a main current path. The "main current path" used in here is referred to as a current path between an anode and a cathode of a diode, a current path between a source and a drain of a field effect transistor, or a whole current path between a collector and an emitter of a bipolar transistor. An "electrode provided outside a main current path" is referred to as an electrode other than an anode, a cathode, a source, a drain, an emitter, and a collector, into which a large current flows. These electrodes include, for example, an electrode configured to fetch a signal from a temperature sensor mounted on semiconductor device 10, an electrode configured to monitor, via another path, a current flowing into a main current path of a semiconductor device, a gate electrode of an MISFET, and a base electrode of a bipolar transistor.

Configuration and Operation of Semiconductor Device 1000

The semiconductor device according to this exemplary embodiment will now specifically be described herein with reference to a Schottky barrier diode as an example.

Figure 2A:
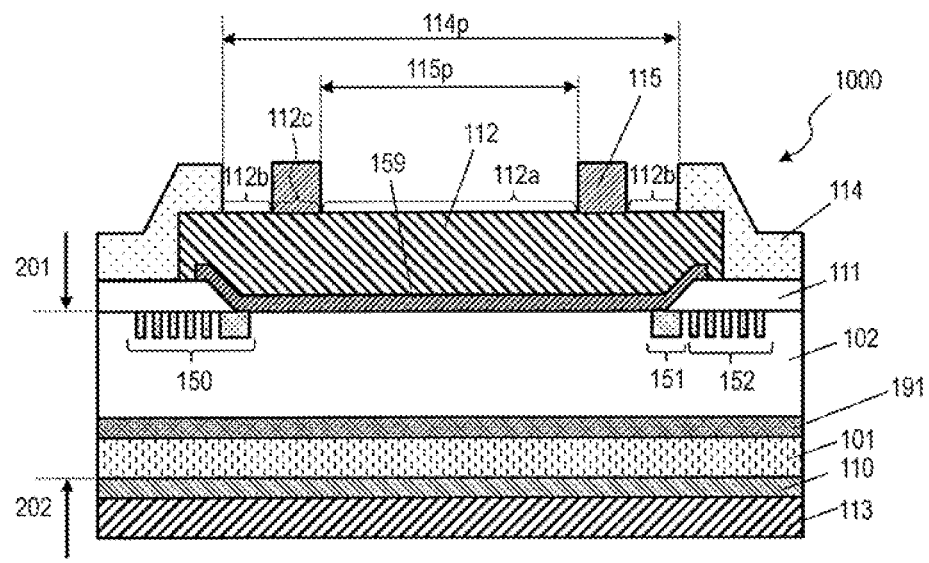
FIG. 2A is a cross-sectional view schematically illustrating an example of semiconductor device (SBD) 1000 according to the first exemplary embodiment.
Figure 2B:
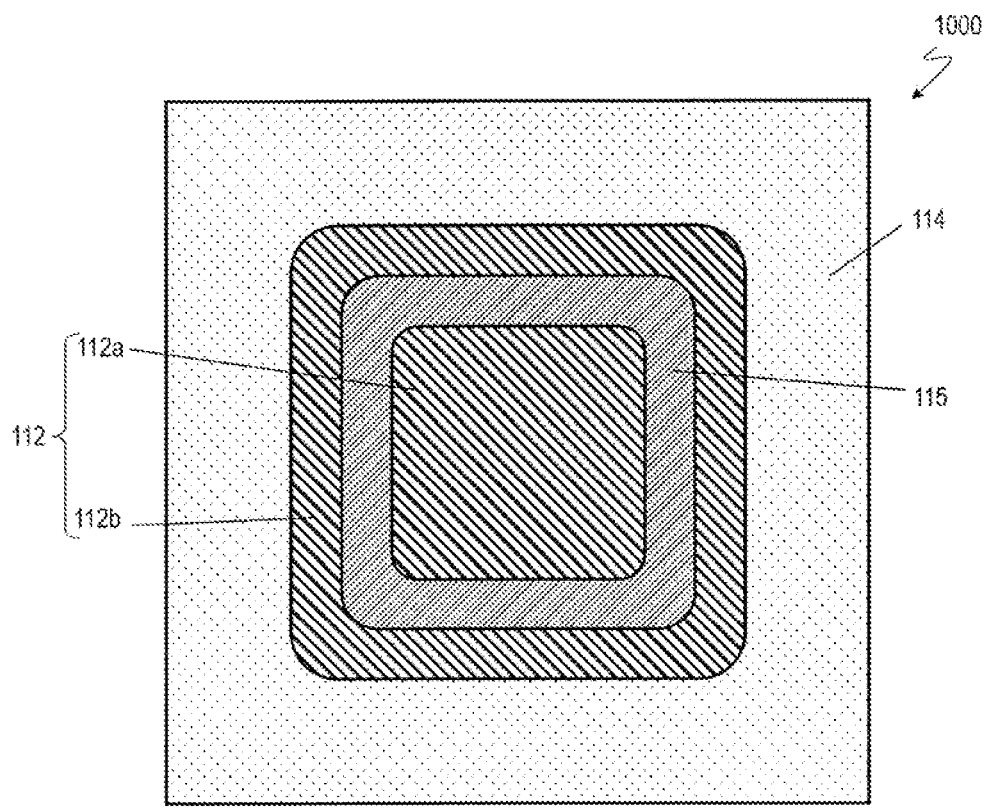
FIG. 2B is a top view schematically illustrating the example of semiconductor device (SBD) 1000 according to the first exemplary embodiment.

FIGS. 2A and 2B respectively are a cross-sectional view and a top view schematically illustrating semiconductor device 1000 according to this exemplary embodiment. Semiconductor device 1000 is a Schottky barrier diode.

Semiconductor device 1000 includes semiconductor substrate 101 and a semiconductor layer. Semiconductor substrate 101 is the first conductivity type. The semiconductor layer is disposed on a main face of semiconductor substrate 101. The semiconductor layer corresponds to the previously described "semiconductor having a predetermined element region". The semiconductor layer includes drift layer 102 that is the first conductivity type. The semiconductor layer may further include buffer layer 191 that is the first conductivity type and that is disposed between drift layer 102 and semiconductor substrate 101. In drift layer 102, termination region 150 that is the second conductivity type may be disposed.

On front face 201 of drift layer 102, first electrode 159 is disposed. First electrode 159 forms a Schottky contact together with drift layer 102. First electrode 159 may abut termination region 150 at an edge of its face abutting drift layer 102.

On first electrode 159, surface electrode 112 is disposed so as to abut an upper face of first electrode 159.

Second electrode 110 is provided to back face 202 of semiconductor substrate 101. Second electrode 110 forms an ohmic contact together with semiconductor substrate 101. Back face electrode 113 may be provided to a lower face of second electrode 110, i.e., a face opposite to a face abutting semiconductor substrate 101.

Termination region 150 includes an electric field relaxation structure. In here, as the electric field alleviation structure, guard ring region 151 and field limiting ring (FLR) region 152 are included. Guard ring region 151 is the second conductivity type, and abuts a part of first electrode 159. FLR region 152 is the second conductivity type floating region. When viewed in a normal direction of the main face of semiconductor substrate 101, FLR region 152 is disposed so as to surround guard ring region 151, but so as not to come into contact with guard ring region 151. When viewed in the normal direction of the main face of semiconductor substrate 101, termination region 150 may have a region surrounding a part of a surface of drift layer 102, and is not limited to the illustrated configuration. For example, termination region 150 may have a junction-termination extension (JTE) structure through which a concentration of impurities that are the second conductivity type varies from a center of semiconductor device 1000 toward its outer edge.

As illustrated in the figures, insulation film 111 may be disposed on drift layer 102. Insulation film 111 may cover FLR region 152 and a part of guard ring region 151. An end face of surface electrode 112 may lie on insulation film 111. Passivation layer (passivation film) 114 is disposed on a part of insulation film 111 and a part of surface electrode 112. Passivation layer 114 covers a part of an upper face and the end face of surface electrode 112. On surface electrode 112, insulating layer 115 at least partially separated from passivation layer 114 is disposed. Passivation layer 114 and insulating layer 115 may contain an identical material. For example, passivation layer 114 and insulating layer 115 may be formed by patterning a single insulation film.

Passivation layer 114 is disposed at an end of semiconductor device 1000, and has first opening portion 114p from which a part of surface electrode 112 is exposed. Insulating layer 115 is disposed on surface electrode 112, and inside first opening portion 114p of passivation layer 114. In this example, insulating layer 115 also has second opening portion 115p from which a part of surface electrode 112 is exposed. When viewed in the normal direction of semiconductor substrate 101, surface electrode 112 is therefore separated by insulating layer 115 into first region 112a and second region 112b. First region 112a lies inside. Second region 112b lies outside. Surface electrode 112 has third region 112c. Third region 112c is a region that lies between first region 112a and second region 112b, and that abuts insulating layer 115. First region 112a and second region 112b are electrically coupled to each other by third region 112c.

Next, how semiconductor device 1000 operates will now be described herein. In semiconductor device 1000, when a positive voltage is applied to first electrode 159 with respect to second electrode 110, a current flows from first electrode 159 to second electrode 110. This direction is defined as a forward direction. The forward direction voltage is referred to as a voltage applied between first electrode 159 and second electrode 110 such that first electrode 159 becomes positive, instead of second electrode 110.

Modified Example

Figure 3A:
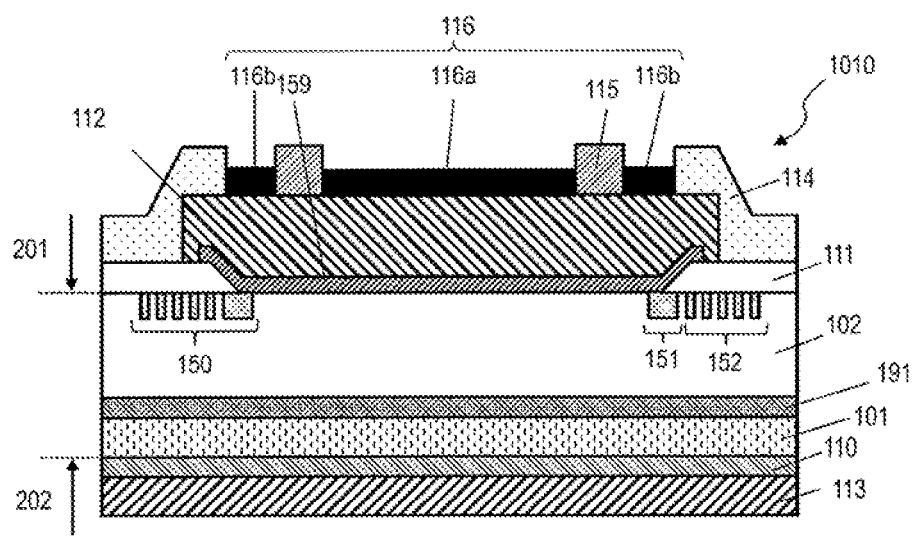
FIG. 3A is a cross-sectional view schematically illustrating an example of semiconductor device 1010 that is another semiconductor device according to the first exemplary embodiment.
Figure 3B:
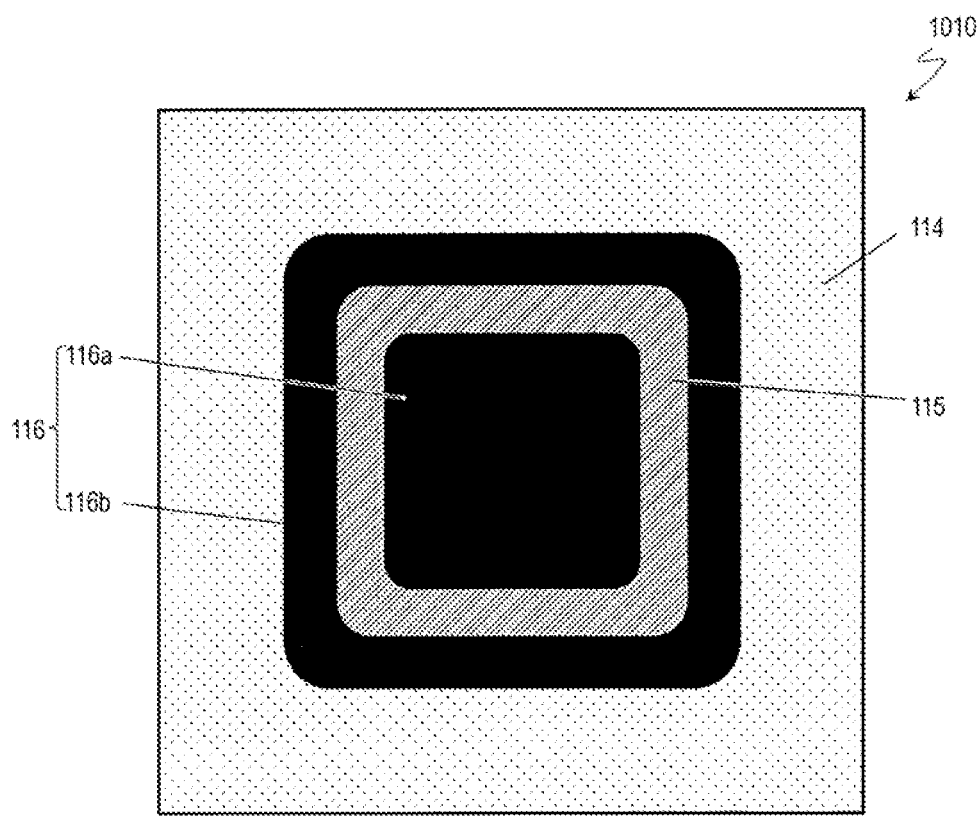
FIG. 3B is a top view schematically illustrating the example of semiconductor device 1010 that is the other semiconductor device according to the first exemplary embodiment.

FIGS. 3A and 3B respectively are a cross-sectional view and a top view of an example of semiconductor device 1010 that is another semiconductor device according to this exemplary embodiment. In FIGS. 3A and 3B, components similar or identical to the components of semiconductor device 1000 shown in FIGS. 2A and 2B are applied with identical reference numerals or symbols. Descriptions of configurations similar or identical to the configurations of semiconductor device 1000 are omitted, but differences will now mainly be described herein.

Semiconductor device 1010 has a configuration in which metal layer 116 is disposed on a region of surface electrode 112 of semiconductor device 1000, which is covered by neither passivation layer 114 nor insulating layer 115. Metal layer 116 may be a metal film that is thicker than first electrode 159, for example. In this example, metal layer 116 includes first portion 116a and second portion 116b. First portion 116a lies on first region 112a of surface electrode 112. Second portion 116b lies on second region 112b. When viewed in the normal direction of semiconductor substrate 101, first portion 116a is surrounded by insulating layer 115, and second portion 116b is surrounded by passivation layer 114 and insulating layer 115.

In semiconductor device 1010, a metal conductor such as a metal wire and a bus bar can be bonded to metal layer 116. Forming metal layer 116 allows a metal flat plate such as a bus bar to be bonded onto an element surface through soldering. When the metal flat plate is bonded, a bonding area can be increased to reduce contact resistance in a bonding portion, compared with a case when a normal metal wire is bonded. Instead of a metal wire, a bus bar may be used to reduce wiring resistance.

Metal layer 116 is formed by performing metal-plating on surface electrode 112, for example. Metal-plating is not formed on insulators, i.e., passivation layer 114 and insulating layer 115, but selectively grows on regions of surface electrode 112, which are exposed from the opening portions of passivation layer 114 and insulating layer 115.

Effects of Semiconductor Devices 1000, 1010

Effects of semiconductor devices 1000, 1010 according to this exemplary embodiment will now be described herein, through comparison with semiconductor devices according to comparative examples, which do not include an insulating layer.

Figure 22A:
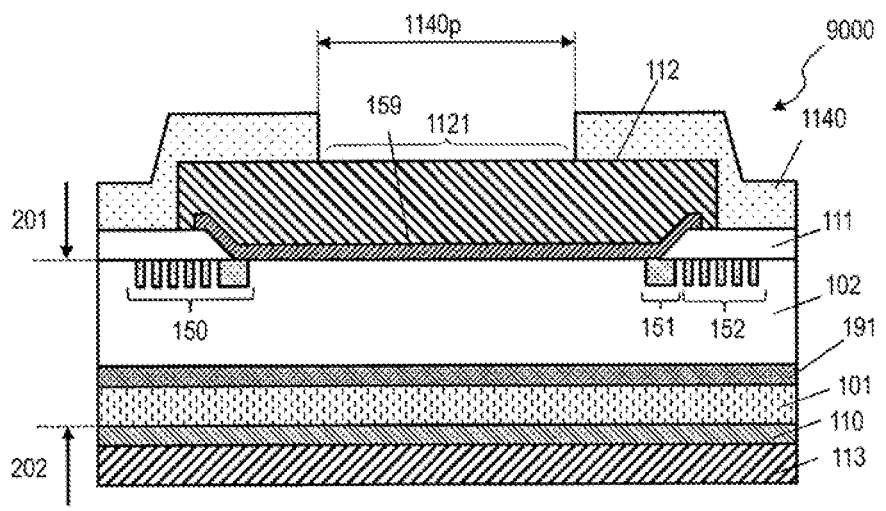
FIG. 22A is a cross-sectional view of semiconductor device 9000 according to a first comparative example.
Figure 22B:
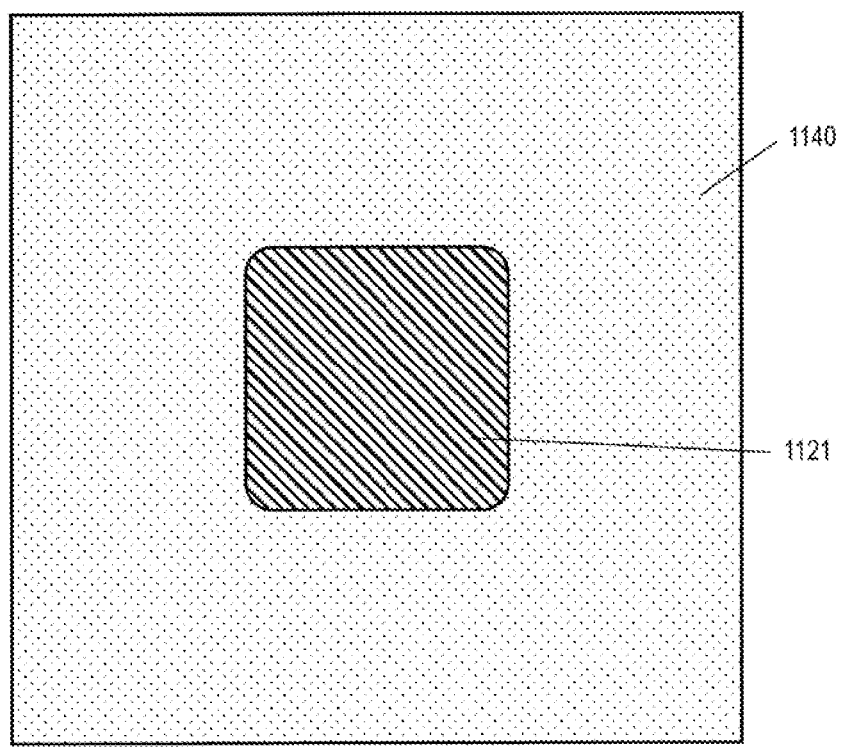
FIG. 22B is a top view of semiconductor device 9000 according to the first comparative example.
Figure 23A:
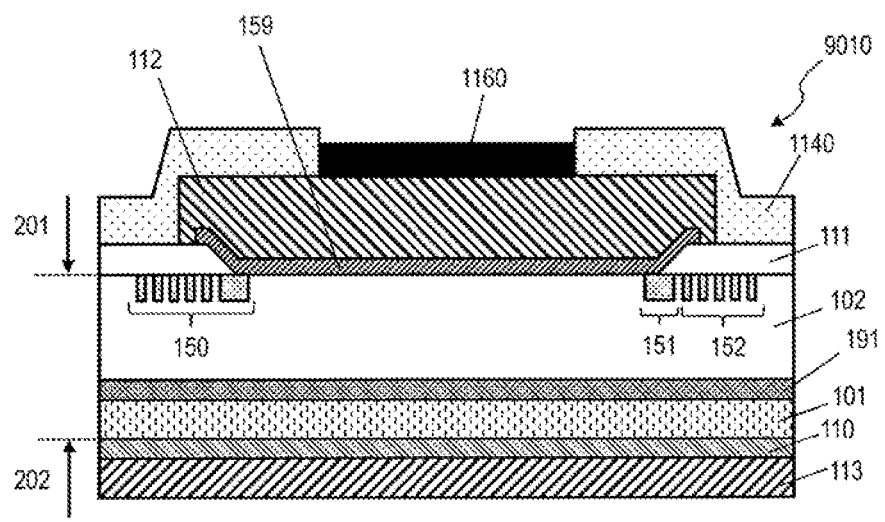
FIG. 23A is a cross-sectional view of semiconductor device 9010 according to the first comparative example.
Figure 23B:
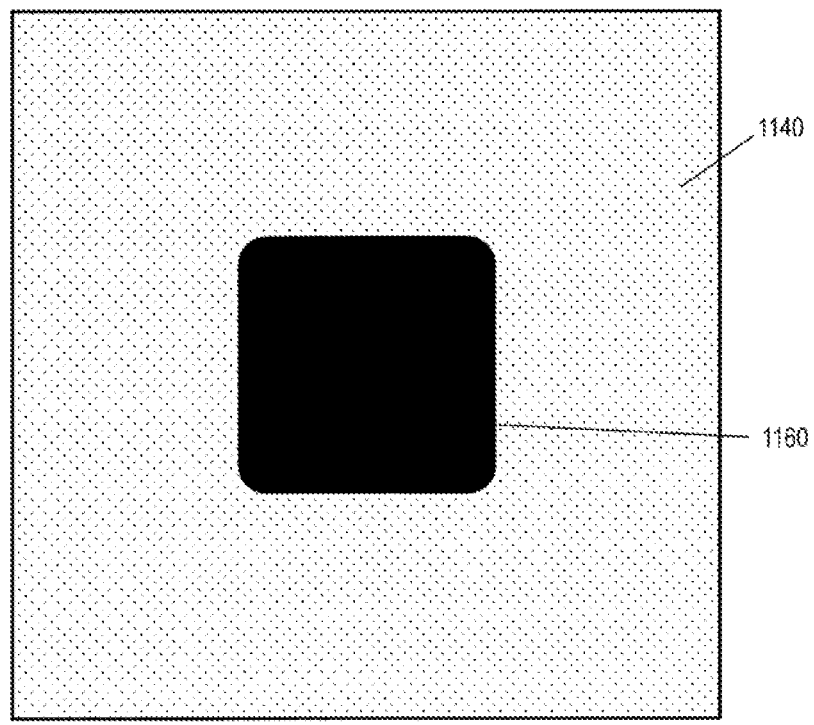
FIG. 23B is a top view of semiconductor device 9010 according to the first comparative example.

FIGS. 22A and 22B respectively are a cross-sectional view and a top view of semiconductor device 9000 according to a first comparative example. FIGS. 23A and 23B respectively are a cross-sectional view and a top view of semiconductor device 9010 according to a second comparative example. In the figures, components identical to the components shown in FIGS. 2A, 2B, 3A, and 3B are applied with identical reference numerals or symbols.

In semiconductor device 9000 according to the first comparative example, passivation layer 1140 covering termination region 150 formed with an electric field relaxation structure covers a peripheral portion of surface electrode 112, and has opening portion 1140p from which a part of surface electrode 112 is exposed. Inside opening portion 1140p, no other protective film is formed, but partial region (hereinafter referred to as "exposure region") 1121 of surface electrode 112 is exposed. Other structures are identical to the structures of semiconductor device 1000 according to this exemplary embodiment.

Semiconductor device 9010 according to the second comparative example has a configuration where metal layer 1160 is disposed on surface electrode 112 of semiconductor device 9000 according to the first comparative example. Inside opening portion 1140p of passivation layer 1140, metal layer 1160 is formed on exposure region 1121 of surface electrode 112.

In an inspection process for semiconductor device 9000, semiconductor device 9000 is put in place on a stage of an inspection device, and a probe or a plurality of probes is allowed to come into contact with exposure region 1121 of surface electrode 112. In particular, when a large current of 10 A or larger is applied, the plurality of probes is required to come into contact with exposure region 1121 of surface electrode 112. It is preferable that the probes be disposed evenly on exposure region 1121. A probe may be disposed adjacent to a side face, which faces opening portion 1140p, of passivation layer 1140. At this time, the probe disposed adjacent to the side face facing opening portion 1140p may damage passivation layer 1140.

In contrast to this, in the inspection process for semiconductor device 1000 shown in FIGS. 2A and 2B, insulating layer 115 is used as a guide to allow a probe to come into contact with only first region 112a lying inside insulating layer 115. Passivation layer 114 does not therefore come into contact with the probe. A probe may be arranged adjacent to a side face, which faces second opening portion 115p, of insulating layer 115, and this probe may damage insulating layer 115. However, since passivation layer 114 is formed so as to be separated from insulating layer 115, passivation layer 114 will not be affected even when insulating layer 115 is degraded, cracked, or peeled off, for example. Therefore, higher reliability than that of conventional semiconductor devices 9000 can be achieved. Effects similar to the above-described effects can be obtained in semiconductor device 1010 when an inspection process is performed before forming metal layer 19.

Next, problems when semiconductor devices 9000 and 9010 according to the first and second comparative examples are respectively incorporated into a discrete package or module will now be described herein.

Figure 24A:
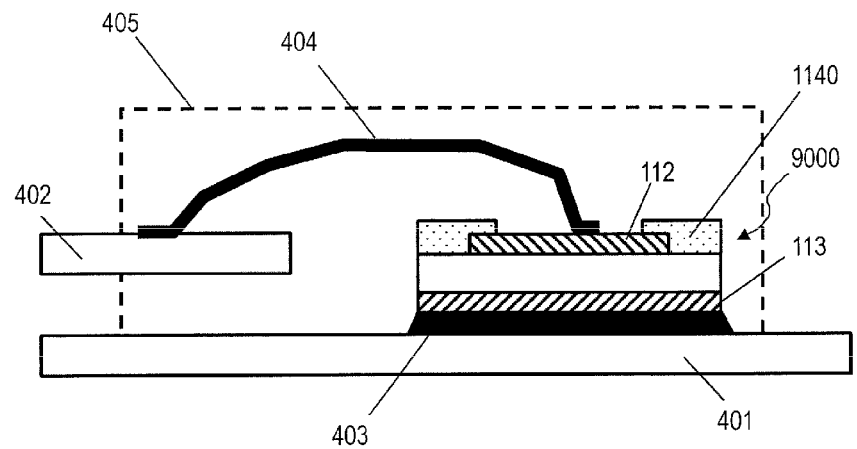
FIG. 24A is a cross-sectional view schematically illustrating a package or a module incorporated with semiconductor device 9000 according to the first comparative example.

FIG. 24A is a cross-sectional view schematically illustrating a module or a package incorporated with semiconductor device 9000 according to the first comparative example. In this example, back face electrode 113 of semiconductor device 9000 is bonded to metal conductor 401 via conductor (e.g., solder) 403. Surface electrode 112 of semiconductor device 9000 is bonded to metal conductor 402 with metal wire 404. FIG. 24A shows single metal wire 404 only, but a plurality of metal wires 404 may be used. Semiconductor device 9000 and metal wire 404 are covered with sealing material 405. Sealing material 405 may be a resin or a gel, for example. Parts of metal conductors 401, 402 extrude from sealing material 405. In here, metal conductor 402 is served as an anode, and metal conductor 401 is served as a cathode.

Figure 24B:
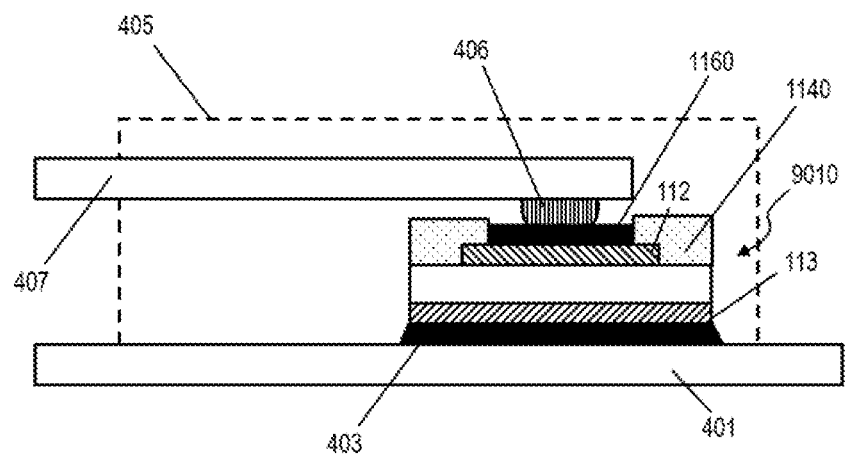
FIG. 24B is a cross-sectional view schematically illustrating a package or a module incorporated with semiconductor device 9010 according to a second comparative example.

FIG. 24B is a cross-sectional view schematically illustrating a module or a package incorporated with semiconductor device 9010 according to the second comparative example. In this example, back face electrode 113 of semiconductor device 9010 is bonded to metal conductor 401 via conductor (e.g., solder) 403. Metal layer 1160 of semiconductor device 9010 is bonded to bus bar 407 made of a metal, via conductor (e.g., solder) 406. Similar to semiconductor device 9000, semiconductor device 9010 and bus bar 407 are covered with sealing material 405. Parts of metal conductor 401 and bus bar 407 extrude from sealing material 405. In here, bus bar 407 is served as an anode, and metal conductor 401 is served as a cathode.

In a wire bonding process for semiconductor device 9000, an Al wire or an Al wire injector of a wire bond device may come into contact with passivation layer 1140, and thus may damage passivation layer 1140. A similar problem can arise when a bus bar is bonded to semiconductor device 9010. As a result, passivation layer 1140 may be degraded, cracked, or peeled off, for example, and thus long-term reliability of semiconductor device 9000 may be impaired.

During a wire or bus bar bonding process, metal layer 1160 can also crack. For example, when a metal wire is bonded onto metal layer 1160, a crack may occur from a contact portion of the metal wire, due to supersonic waves or a load applied during bonding. When a metal flat plate such as a bus bar is bonded onto metal layer 1160 through soldering, a crack may also occur due to a load when bonding, stress when powered, or stress of metal fatigue, for example, in an environment where a temperature repeatedly increases and decreases. Such a crack can negatively affect passivation layer 1140, and, as a result, can impair long-term reliability of semiconductor device 9010.

Figure 4A:
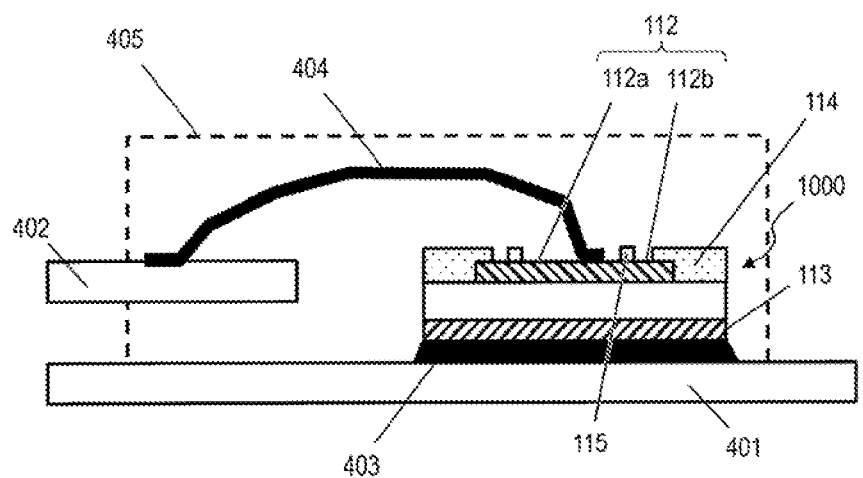
FIG. 4A is a cross-sectional view schematically illustrating a package or a module incorporated with semiconductor device 1000.
Figure 4B:
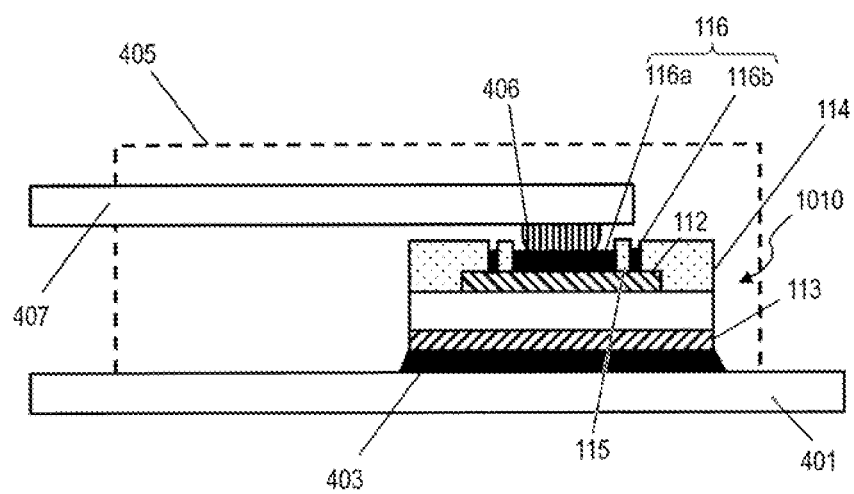
FIG. 4B is a cross-sectional view schematically illustrating the package or the module incorporated with semiconductor device 1010.

In contrast to this, in this exemplary embodiment, a single Al wire or a plurality of Al wires is selectively bonded onto first region 112a of surface electrode 112, which lies inside insulating layer 115, when semiconductor device 1000 is incorporated into a package, for example, as shown in FIG. 4A. Or, as shown in FIG. 4B, when semiconductor device 1010 is incorporated into a package, for example, a bus bar is selectively bonded onto first portion 116a of metal layer 116, which lies inside insulating layer 115. Therefore, a wire or a bus bar, for example, can be prevented from directly coming into contact with passivation layer 114. Even when a wire or a bus bar, for example comes into contact with insulating layer 115, and thus insulating layer 115 is degraded, cracked, or peeled off, for example, passivation layer 114 can be less likely to be affected since passivation layer 114 is separately formed from insulating layer 115.

In a wire or bus bar bonding process, if metal layer 116 may crack, only first portion 116a of metal layer 116 can crack, to which the wire will be bonded, for example. The crack occurred on first portion 116a is less likely to extend to passivation layer 114 since insulating layer 115 and second portion 116b of metal layer 116 are interposed. Therefore, decrease in long-term reliability of passivation layer 114 due to a crack occurred when a wire is bonded, for example, can be suppressed.

A probe mark may be formed on surface electrode 112 when a probe is applied in an inspection process performed for semiconductor device 9000. Problems described below can arise when metal layer 1160 is disposed on surface electrode 112 to form semiconductor device 9010 from this state.

Figure 25A:
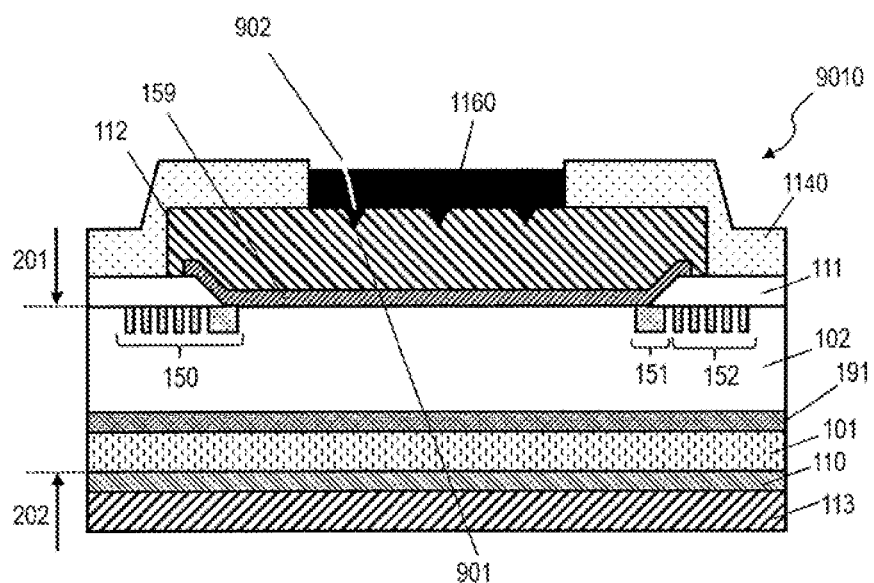
FIG. 25A is a cross-sectional view schematically illustrating an example of semiconductor device 9010 when a metal layer is cracked.
Figure 25B:
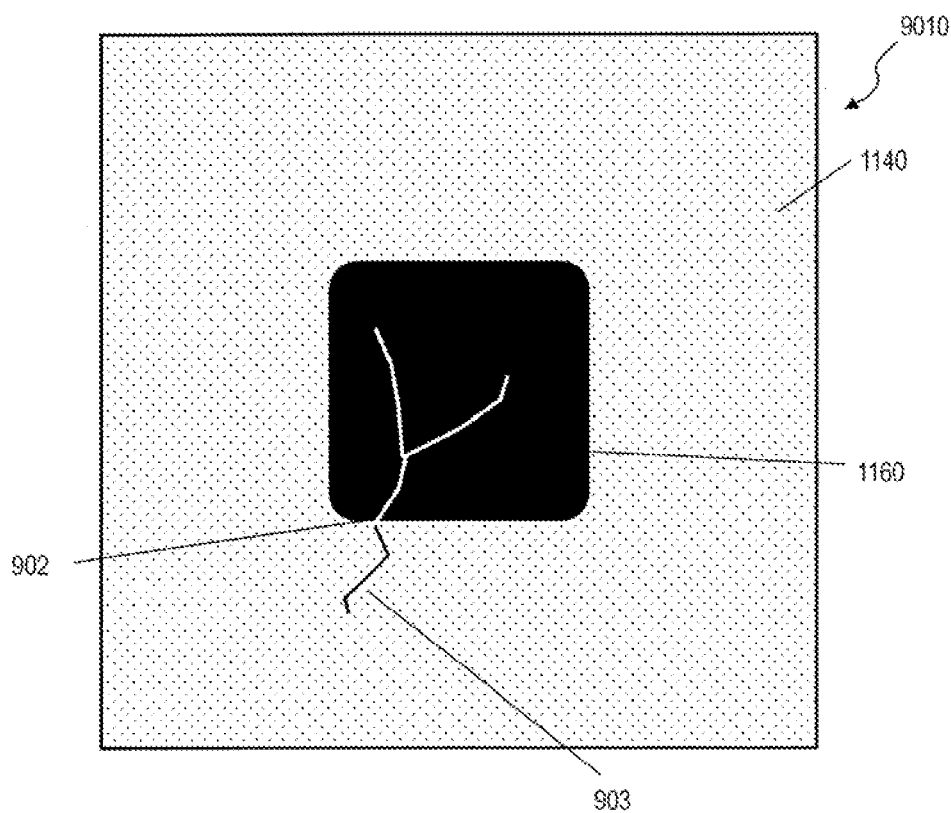
FIG. 25B is a top view schematically illustrating the example of semiconductor device 9010 when the metal layer is cracked.

FIGS. 25A and 25B respectively are a cross-sectional view and a top view of semiconductor device 9010 obtained by providing metal layer 1160 after an inspection process. As illustrated in the figures, probe mark 901 caused in the inspection process is present on surface electrode 112, and thus a surface of surface electrode 112 is unevenly formed. When metal layer 1160 is formed on surface electrode 112 on which probe mark 901 is present, probe mark 901 may cause crack 902 to occur on metal layer 1160. In particular, when metal layer 1160 is formed through metal plating, passivation layer 1140 and metal layer 1160 closely abut each other, and, if crack 902 extends to an end of metal layer 1160, crack 903 may extend to passivation layer 1140, as shown in FIG. 25B. Or, passivation layer 1140 may be partially peeled off from surface electrode 112 when passivation layer 1140 is stressed unexpectedly by crack 902. If an abnormality occurs in passivation layer 1140, passivation layer 1140 can degrade due to moisture and ions, for example, for a long period of time even when the semiconductor device is sealed with a resin, for example. As a result, a disturbance due to moisture and ions, for example, may reach insulation film 111, and thus long-term reliability of semiconductor device 9000 may be impaired.

In contrast to this, in this exemplary embodiment, the above-described problems do not occur even when metal layer 116 is formed after an inspection process.

Figure 5A:
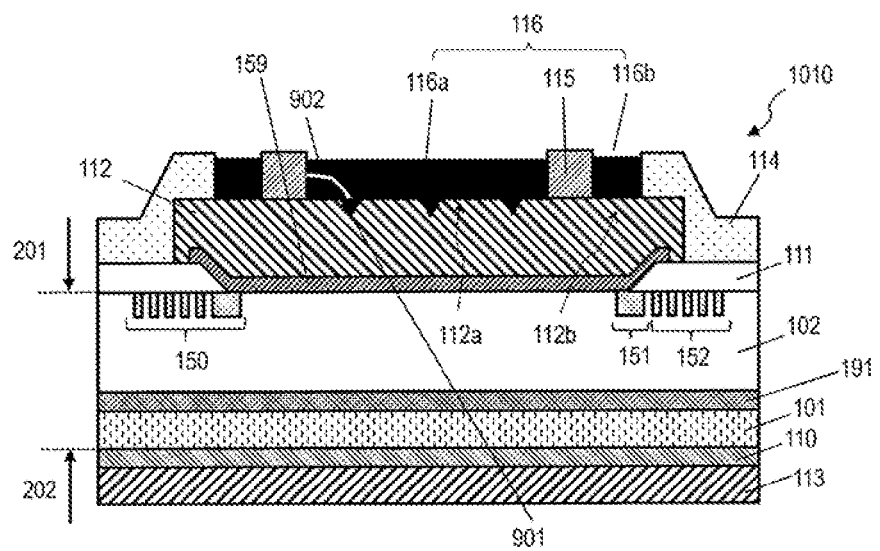
FIG. 5A is a cross-sectional view schematically illustrating an example of semiconductor device 1010 when a metal layer is cracked.
Figure 5B:
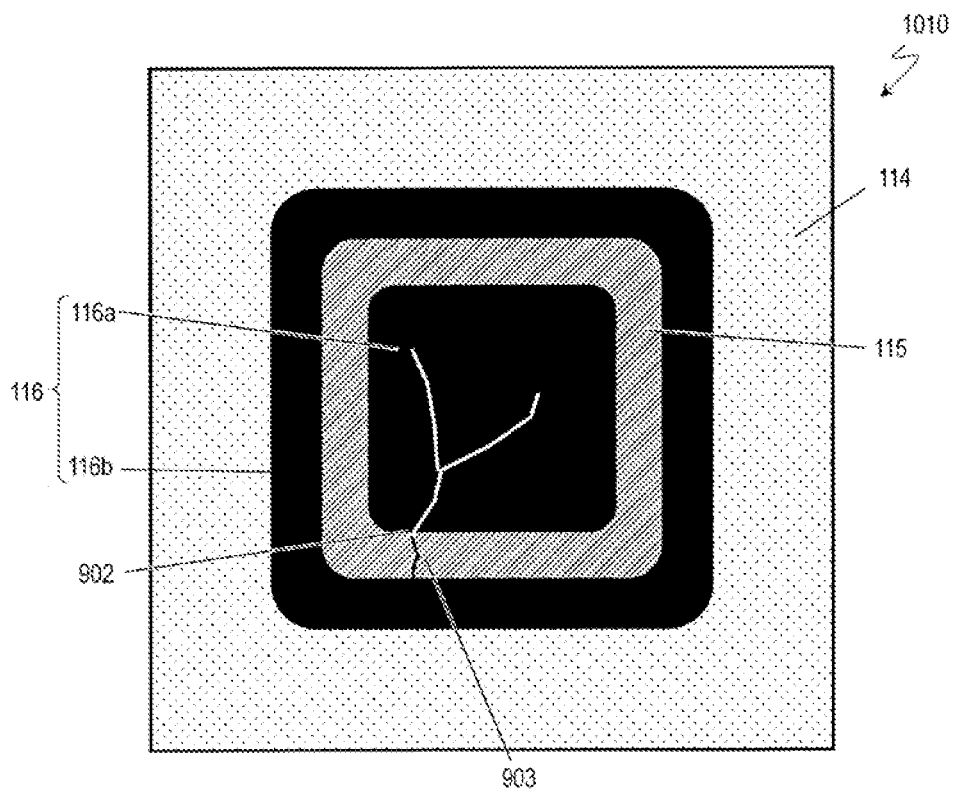
FIG. 5B is a top view schematically illustrating the example of semiconductor device 1010 when the metal layer is cracked.

FIGS. 5A and 5B respectively are a cross-sectional view and a top view of semiconductor device 1010 obtained by forming metal layer 116 after an inspection process.

During an inspection process, probe mark 901 is formed only on first region 112a in a second opening portion of insulating layer 115. Probe mark 901 will not be formed on second region 112b since a probe does not come into contact with second region 112b. When metal layer 116 is formed through metal plating, for example, on surface electrode 112, probe mark 901 may cause crack 902 to occur on first portion 116a of metal layer 116. In particular, when metal layer 116 is formed through metal plating, passivation layer 114, insulating layer 115, and first portion 116a and second portion 116b of metal layer 116 closely abut to each other. Therefore, if crack 902 extends to an end of first portion 116a of metal layer 116, crack 903 may also occur on insulating layer 115, as shown in FIG. 5B. Or, insulating layer 115 may be partially peeled off from surface electrode 112 when insulating layer 115 is stressed unexpectedly by crack 902. As described above, if an abnormality occurs in insulating layer 115, insulating layer 115 may degrade due to moisture and ions, for example, for a long period of time, even when semiconductor device 1010 is sealed with a resin, for example.

However, in this exemplary embodiment, insulating layer 115 is separated from passivation layer 114, via metal layer 116. Therefore, even when crack 903 occurs on insulating layer 115, crack 903 can be less likely to extend over second portion 116b of metal layer 116 to passivation layer 114. Therefore, decrease in function of passivation layer 114 due to crack 902 and crack 903 can be suppressed, and thus long-term reliability can be secured.

How to produce semiconductor device 1000 and semiconductor device 1010

How to produce semiconductor device 1000 and semiconductor device 1010 according to this exemplary embodiment will now be described herein with reference to FIGS. 6 to 16. FIGS. 6 to 16 respectively are process cross-sectional views illustrating how to produce semiconductor device 1000 and semiconductor device 1010.

First semiconductor substrate 101 is prepared. Semiconductor substrate 101 is, for example, a low resistance, n-type 4H—SiC off-cut substrate having a resistivity of approximately 0.02 Ωcm. An SiC off-cut substrate is referred to as a substrate obtained by cutting a crystal face of SiC at a certain angle. A substrate obtained by 4 degree off-cut (0001) Si face substrate is used in here.

Figure 6:
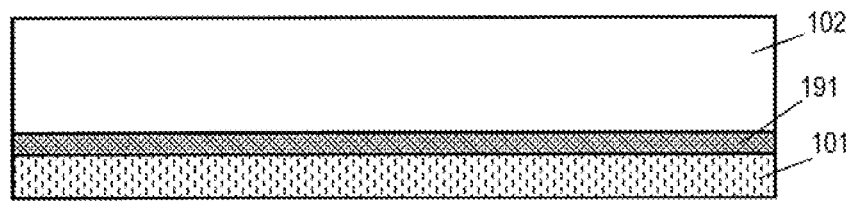
FIG. 6 is a cross-sectional view schematically illustrating an example of a production process for semiconductor devices according to the first exemplary embodiment.

As shown in FIG. 6, high resistance, n-type drift layer 102 is formed on semiconductor substrate 101 through epitaxial growth. Before drift layer 102 is formed, buffer layer 191 made of SiC that is n-type, and that has a higher impurity concentration may be accumulated on semiconductor substrate 101. An impurity concentration of buffer layer 191 is $1 \times 10^{18}$ cm$^{-3}$, for example, and a thickness of buffer layer 191 is 0.5 µm, for example. Drift layer 102 is made of n-type 4H—SiC, for example. An impurity concentration and a thickness of drift layer 102 respectively are $1.0 \times 10^{16}$ cm$^{-3}$ and 10 µm, for example.

Figure 7:
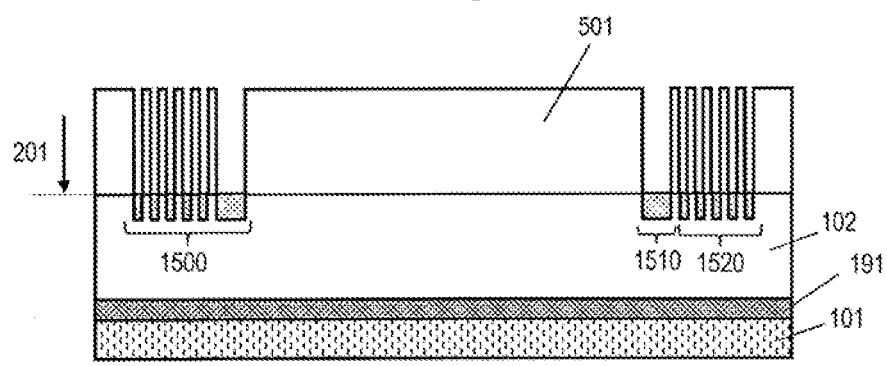
FIG. 7 is a cross-sectional view schematically illustrating the example of the production process for semiconductor devices according to the first exemplary embodiment.

Next, as shown in FIG. 7, after mask 501 made of SiO$_2$, for example, is formed on drift layer 102, p-type impurity ions such as Al ions are injected into drift layer 102. Termination injection region 1500 including guard ring injection region 1510 and field limiting ring (FLR) injection region 1520 is thus formed in drift layer 102. Termination injection region 1500, guard ring injection region 1510, and FLR injection region 1520 then respectively become termination region 150, guard ring region 151, and FLR region 152. An injection dosage for each of termination injection region 1500, guard ring injection region 1510, and FLR injection region 1520 is $4.6 \times 10^{15}$ cm$^{-2}$. When impurities are injected, semiconductor substrate 101 may be heated to a temperature in a range from 300° C. to 500° C. inclusive, for example. At this time, impurity injection energy is adjusted such that a bonding depth to a pn junction to be formed between termination region 150 and drift layer 102 is approximately 1 µm from front face 201 of drift layer 102, for example. After the impurities are injected, mask 501 is removed.

Figure 8:
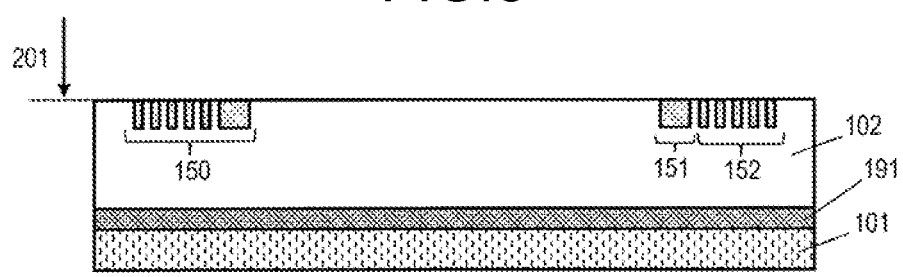
FIG. 8 is a cross-sectional view schematically illustrating the example of the production process for semiconductor devices according to the first exemplary embodiment.

Next, as shown in FIG. 8, by performing a heat treatment at a temperature in a range from 1500° C. to 1900° C. inclusive, termination region 150, guard ring region 151, and FLR region 152 are respectively formed from termination injection region 1500, guard ring injection region 1510, and FLR injection region 1520. Before a heat treatment is performed, a carbon film may be accumulated on a surface of drift layer 102, and then, after the heat treatment is performed, the carbon film may be removed. Or, after that, after a thermal oxide film is formed on at least front face 201 of drift layer 102, the thermal oxide film may be removed through etching to clean front face 201 of drift layer 102.

Figure 9:
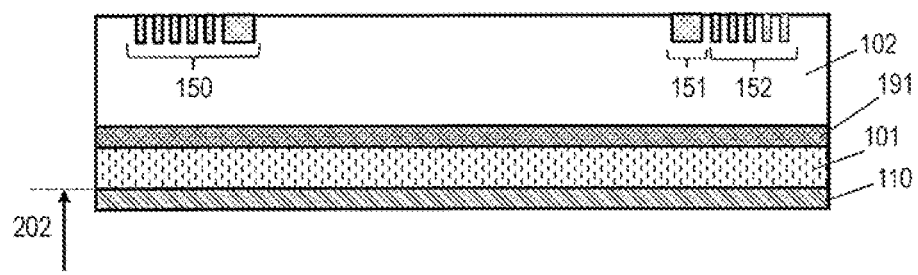
FIG. 9 is a cross-sectional view schematically illustrating the example of the production process for semiconductor devices according to the first exemplary embodiment.
Figure 10:
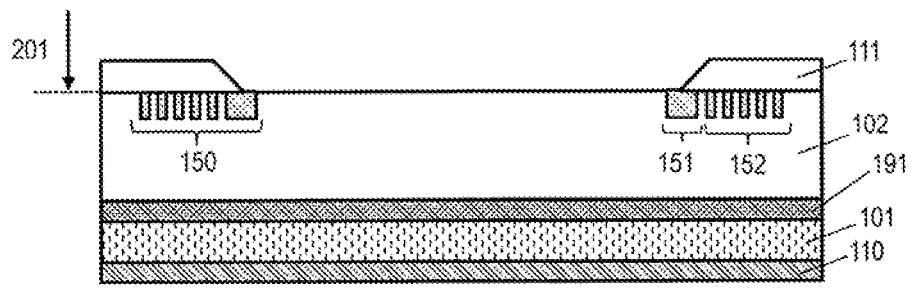
FIG. 10 is a cross-sectional view schematically illustrating the example of the production process for semiconductor devices according to the first exemplary embodiment.

Next, as shown in FIG. 9, after nickel (Ni), for example, is allowed to accumulate at a thickness of approximately 200 nm on back face 202 of semiconductor substrate 101, a heat treatment is performed at a temperature in a range from 800° C. to 1050° C. inclusive to form second electrode 110. Second electrode 110 forms an ohmic contact together with back face 202 of semiconductor substrate 101. Although Ni has been selected as an electrode material in here, another metal may be used as long as the metal can react with semiconductor substrate 101 to form silicide or carbide. A temperature for a heat treatment may be selected separately in accordance with a selected metallic material. As long as the ohmic contact can be achieved, a temperature for a heat treatment may fall within a range from 200° C. to 600° C. inclusive, for example.

Next, an insulation film made of SiO$_2$, for example, is formed on the surface of drift layer 102. A thickness of the insulation film is 300 nm, for example. Next, a mask is formed through photo-resist to allow a part of guard ring region 151 and drift layer 102 inside guard ring region 151 to expose through wet etching, for example. The mask is then removed. As described above, as shown in FIG. 10, insulation film 111 having an opening can be obtained.

Figure 11:
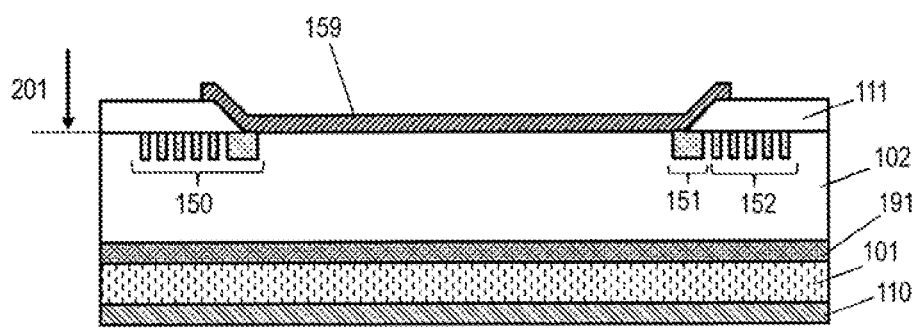
FIG. 11 is a cross-sectional view schematically illustrating the example of the production process for semiconductor devices according to the first exemplary embodiment.

Next, a first electrode conductive film is accumulated so as to wholly cover insulation film 111 having the opening and drift layer 102 exposed in the opening. The first electrode conductive film is made of a material such as Ti, Ni, and Mo. A thickness of the first electrode conductive film is 200 nm, for example. After that, a mask is formed through photo-resist, and then the first electrode conductive film is patterned such that a portion that covers drift layer 102 exposed from at least insulation film 111 remains. First electrode 159 can thus be obtained, as shown in FIG. 11. In the example shown in FIG. 11, an edge of first electrode 159 lies on insulation film 111. First electrode 159 abuts drift layer 102 that is exposed, as well as abuts the part of guard ring region 151. After that, a heat treatment is performed for semiconductor substrate 101 including first electrode 159 at a temperature in a range from 100° C. to 700° C. inclusive. First electrode 159 thus forms a Schottky contact together with drift layer 102.

Figure 12:
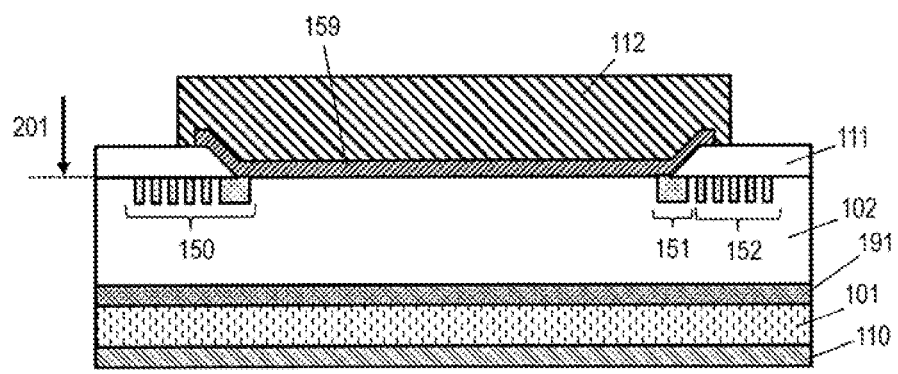
FIG. 12 is a cross-sectional view schematically illustrating the example of the production process for semiconductor devices according to the first exemplary embodiment.

Next, a surface electrode conductive film is accumulated on first electrode 159 and insulation film 111. The surface electrode conductive film is a metal film that contains Al, for example, and that has a thickness of approximately 4 µm. A mask is formed on the surface electrode conductive film, and unnecessary portions are etched to allow a part of insulation film 111 to be exposed. When wet etching is to be performed for the surface electrode conductive film, an etching condition for the surface electrode conductive film may be adjusted such that first electrode 159 will not be exposed. By removing the mask after the part of the surface electrode conductive film is etched, surface electrode 112 is formed as shown in FIG. 12.

Figure 13:
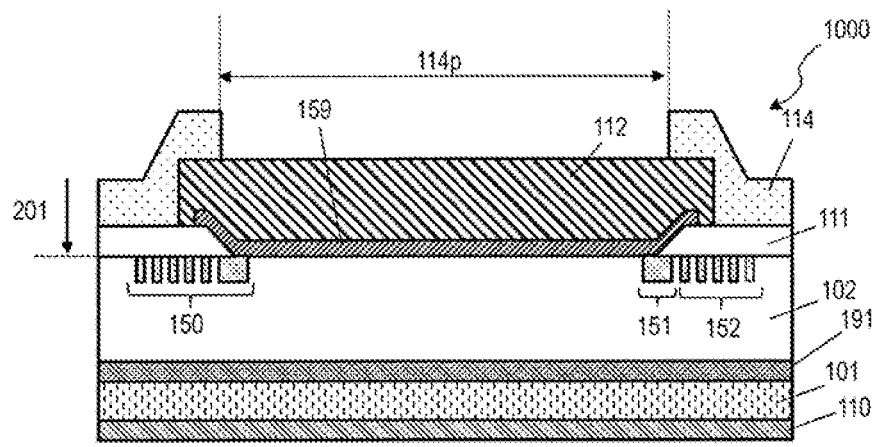
FIG. 13 is a cross-sectional view schematically illustrating the example of the production process for semiconductor devices according to the first exemplary embodiment.

Next, passivation layer 114 is formed as shown in FIG. 13. First an inorganic protective film made of SiN, for example, or an organic protective film made of polyimide, for example, is formed as passivation layer 114 on insulation film 111 and surface electrode 112, which are exposed. After that, a mask having an opening allowing passivation layer 114 formed on an upper portion of surface electrode 112 to be exposed is prepared, and then a part of passivation layer 114 is etched to form first opening portion 114p that allows a part of surface electrode 112 to be exposed. After that, the mask is removed. As long as passivation layer 114 is an insulator, passivation layer 114 may be another inorganic protective film (e.g., SiO$_2$) or another organic protective film (e.g., polybenzoxazole).

Figure 14:
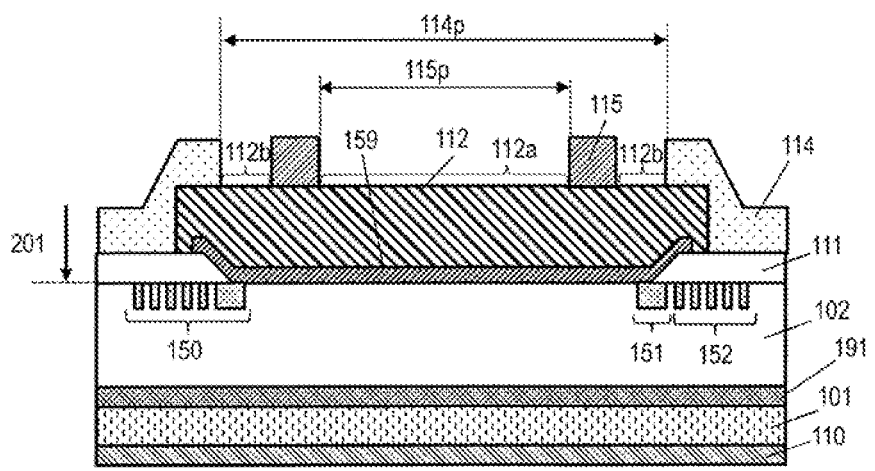
FIG. 14 is a cross-sectional view schematically illustrating the example of the production process for semiconductor devices according to the first exemplary embodiment.

Next, insulating layer 115 is formed as shown in FIG. 14. First an inorganic insulation film made of SiN or SiO$_2$, for example, or an organic insulation film made of polyimide, for example, is formed as insulating layer 115 on surface electrode 112 and passivation layer 114, which are exposed. After that, a mask having an opening allowing insulating layer 115 formed on the upper portion of surface electrode 112 to be exposed is prepared, and then a part of insulating layer 115 is etched to form second opening portion 115p that allows a part of surface electrode 112 to be exposed. After that, the mask is removed. Second opening portion 115p is disposed inside first opening portion 114p of passivation layer 114. As long as insulating layer 115 is an insulator, insulating layer 115 may be another inorganic insulation film (e.g., SiO$_2$) or another organic insulation film (e.g., polybenzoxazole). However, it is preferable that a material of insulating layer 115 be different from a material of passivation layer 114 such that passivation layer 114 is less likely to be damaged when insulating layer 115 is etched. In a region from which surface electrode 112 is exposed, a region surrounded by second opening portion 115p is regarded as first region 112a, and a region lying between passivation layer 114 and insulating layer 115 is regarded as second region 112b.

In here, thicknesses of passivation layer 114 and insulating layer 115 each range from approximately 0.3 μm to approximately 10 μm, for example. A width of insulating layer 115 in an in-plane direction of both of semiconductor device 1000 and semiconductor device 1010 ranges from approximately 5 μm to approximately 500 μm, for example. A gap between passivation layer 114 and insulating layer 115 falls within a range from approximately 5 μm to approximately 50 μm, for example.

On the other hand, passivation layer 114 and insulating layer 115 may be simultaneously formed with a single material. In this case, a semiconductor device production process can be simplified. For a structure shown in FIG. 13, first an insulation film (e.g., inorganic insulation film made of SiN, for example, or an organic insulation film made of polyimide, for example) is formed on insulation film 111 and surface electrode 112, which are exposed. After that, a mask having an opening allowing the insulation film to be exposed at a plurality of regions is prepared, and then a part of the insulation film is etched to allow a part of surface electrode 112 to be exposed. In here, second opening portion 115p and an annular opening portion lying outside second opening portion 115p are formed on the insulation film. As described above, passivation layer 114 and insulating layer 115 are formed simultaneously from the insulation film. After that, the mask is removed. As long as passivation layer 114 is an insulator, passivation layer 114 may be another inorganic protective film (e.g., SiO$_2$) or another organic protective film (e.g., polybenzoxazole).

Figure 15:
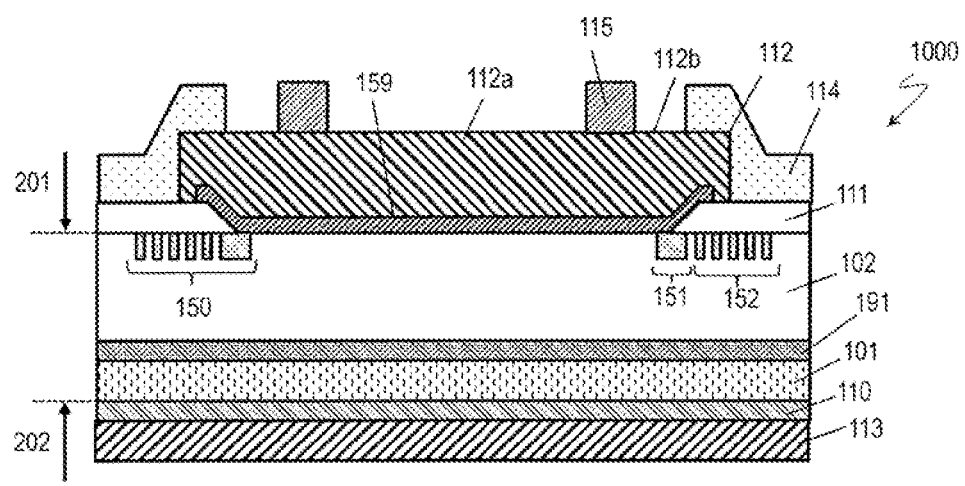
FIG. 15 is a cross-sectional view schematically illustrating the example of the production process for semiconductor devices according to the first exemplary embodiment.

Next, as shown in FIG. 15, back face electrode 113 is formed as required. A process of forming back face electrode 113 may be performed before a process of forming passivation layer 114 and insulating layer 115 described above, or before a process of forming surface electrode 112. For back face electrode 113, Ti, Ni, and Ag are deposited in order from a side abutting second electrode 110, for example. Respective thicknesses of Ti, Ni, and Ag are 0.1 μm, 0.3 μm, and 0.7 μm, for example. Semiconductor element 1000 is formed through the above-described processes.

Figure 16:
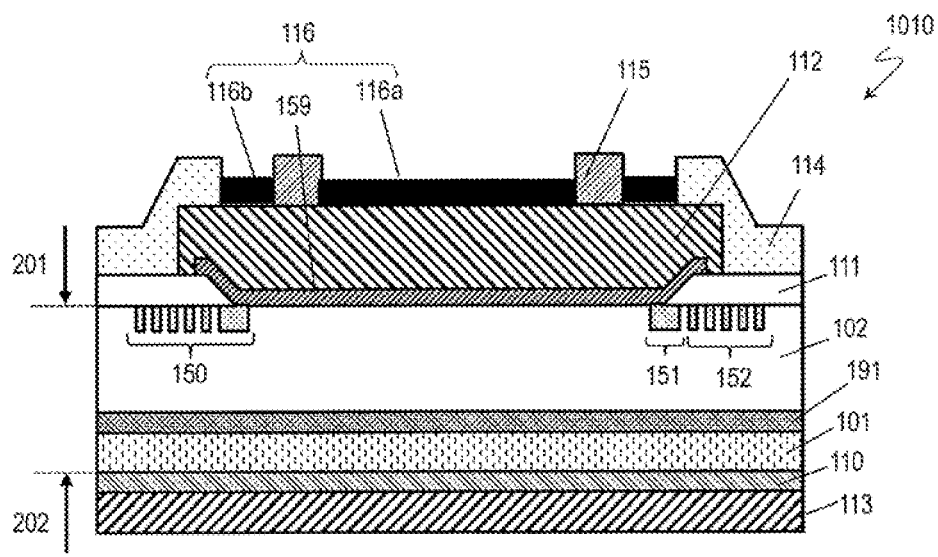
FIG. 16 is a cross-sectional view schematically illustrating the example of the production process for semiconductor devices according to the first exemplary embodiment.

As shown in FIG. 16, semiconductor device 1010 can be obtained by forming metal layer 116 on a surface of semiconductor device 1000. Metal layer 116 is formed as described below, for example. First, back face electrode 113 of semiconductor device 1000 is applied with a piece of tape for protection, for example, such that back face electrode 113 will not be exposed. Next, a surface treatment is performed for easy plating for surface electrode 112 that is not covered with passivation layer 114 and insulating layer 115, and then surface electrode 112 is immersed in a plating solution to form metal layer 116 on surface electrode 112. At this time, passivation layer 114 and insulating layer 115 are insulation films, and thus are not plated, but metal layer 116 selectively grows on surface electrode 112 that is exposed. Therefore, metal layer 116 is formed on first region 112a and second region 112b. First portion 116a formed on first region 112a of metal layer 116, and second portion 116b formed on second region 112b of metal layer 116 are separated by insulating layer 115. In here, as non-electrolytic plating, a metal film mainly containing Ni, for example, is plated in a thickness ranging from approximately 3 μm to approximately 10 μm to form metal layer 116. A thickness of metal layer 116 may be thinner than each of thicknesses of passivation layer 114 and insulating layer 115. Since metal layer 116 mainly made of Ni is harder than surface electrode 112 mainly made of Al, for example, metal layer 116 can easily crack, compared with a case when electrical bonding for an external electrode is formed on surface electrode 112. However, as shown in FIG. 16, metal layer 116 is separated by insulating layer 115 into first portion 116a and second portion 116b, and thus insulating layer 115 is separated from passivation layer 114. Therefore, even if first portion 116a cracks, and the crack extends outward of a chip, the crack does not extend to passivation layer 114 since insulating layer 115 and second portion 116b of metal layer 116 are interposed. Passivation layer 114 thus is not impaired for its function. As a result, even if first portion 116a cracks, long-term reliability of semiconductor device 1010 is not negatively affected.

The above examples have been described based on non-electrolytic plating. However, metal layer 116 may be formed through electrolytic plating. Metal layer 116 may be formed using another method (e.g., vapor deposition or sputtering). However, in this case, it is preferable that metal layer 116 be separated into first portion 116a and second portion 116b through another additional etching process.

Second Exemplary Embodiment

A semiconductor device according to a second exemplary embodiment of the present disclosure will now be described herein with reference to the accompanying drawings. The semiconductor device according to this exemplary embodiment includes a plurality of surface electrodes. A configuration of the semiconductor device according to this exemplary embodiment will now be described herein with reference to a vertical MISFET made of SiC as an example.

Figure 17A:
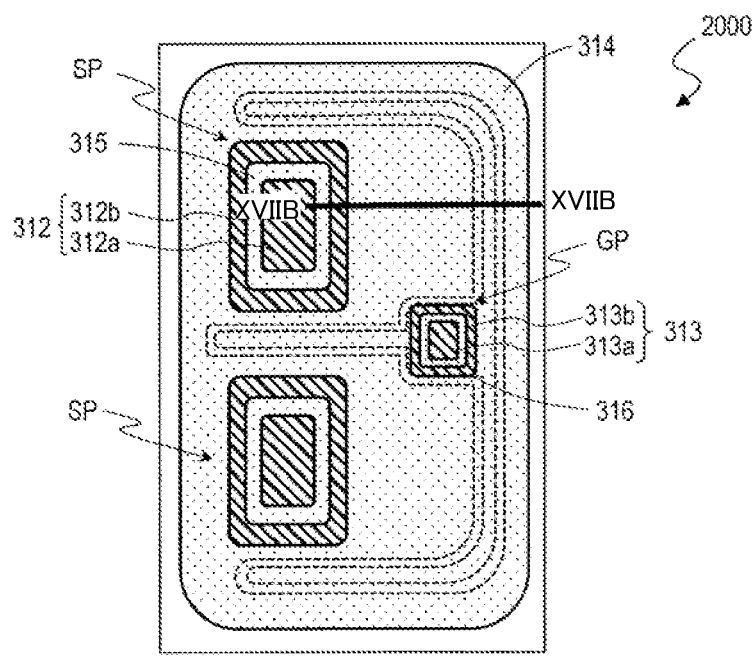
FIG. 17A is a top view schematically illustrating an example of semiconductor device (MISFET) 2000 according to a second exemplary embodiment.
Figure 17B:
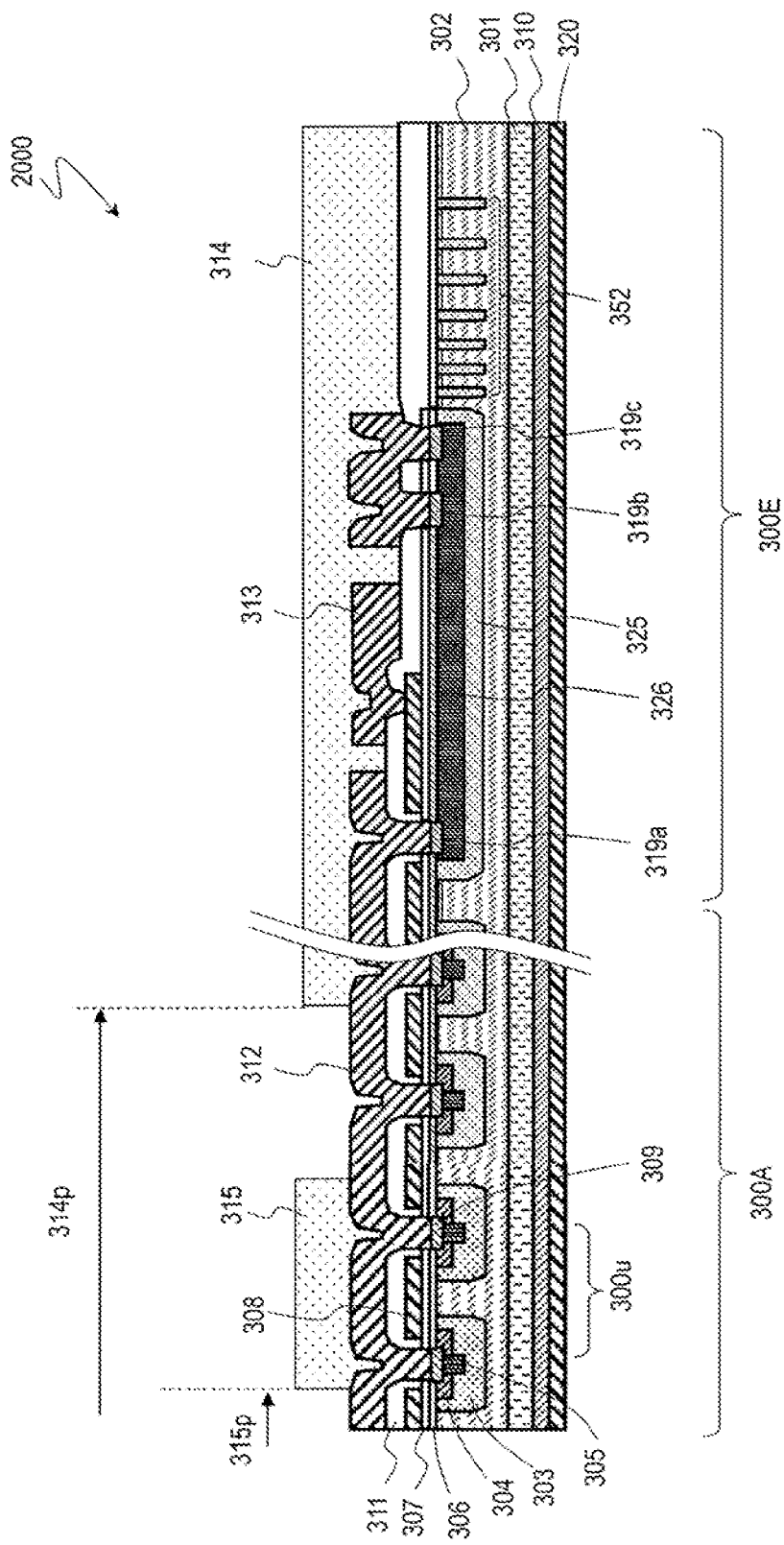
FIG. 17B is a cross-sectional view schematically illustrating the example of semiconductor device (MISFET) 2000 according to the second exemplary embodiment.

FIG. 17A is a top view of semiconductor device 2000 according to this exemplary embodiment, and FIG. 17B is a cross-sectional view of semiconductor device 2000 taken along line XVIIB-XVIIB shown in FIG. 17A. Semiconductor device 2000 includes silicon carbide substrate 301 and first silicon carbide semiconductor layer (drift layer) 302. Silicon carbide substrate 301 is a first conductivity type. First silicon carbide semiconductor layer 302 lies on a main face of silicon carbide substrate 301. First silicon carbide semiconductor layer 302 corresponds to the previously described "semiconductor having a predetermined element region". Silicon carbide substrate 301 has a back face at which drain electrode 310 and back face electrode (wiring electrode) 320 provided to drain electrode 310 lie. In this exemplary embodiment, the first conductivity type is n-type, and a second conductivity type is p-type. However, the first conductivity type may be p-type, and the second conductivity type may be n-type.

Silicon carbide substrate 301 includes active region 300A and termination region 300E. When viewed in a direction perpendicular to the main face of silicon carbide substrate 301, termination region 300E surrounds active region 300A.

Semiconductor device 2000 includes a plurality of unit cells 300u lying on active region 300A. The plurality of unit cells 300u respectively functions as an MISFET, and is respectively coupled in parallel to each other. In other words, unit cells 300u configure transistors, and thus semiconductor device 2000 includes a plurality of transistors.

When viewed in the direction perpendicular to the main face of silicon carbide substrate 301, the plurality of unit cells 300u is arranged in a two-dimensional manner.

Each of unit cells 300u includes silicon carbide substrate 301, first silicon carbide semiconductor layer 302, first body region 303, source region 304, gate insulating film 307, and gate electrode 308. Silicon carbide substrate 301 is the first conductivity type. First silicon carbide semiconductor layer 302 is the first conductivity type. First body region 303 is the second conductivity type. First silicon carbide semiconductor layer 302 lies on silicon carbide substrate 301. First body region 303 is selectively formed on a surface of first silicon carbide semiconductor layer 302. Source region 304 is selectively formed on a surface of first body region 303. Gate insulating film 307 lies above first silicon carbide semiconductor layer 302. Gate electrode 308 lies on gate insulating film 307. Second silicon carbide semiconductor layer 306 may be provided as a channel layer between first silicon carbide semiconductor layer 302 and gate insulating film 307.

In first silicon carbide semiconductor layer 302, source region 304 contains high concentration, first conductivity type impurities. In other words, source region 304 contains $n^+$-type impurities. For electrical coupling to first body region 303, first contact region 305 that is the second conductivity type is provided at a position abutting first body region 303 inside and under source region 304. First contact region 305 that is the second conductivity type contains second conductivity type impurities at a concentration higher than a concentration of second conductivity type impurities in first body region 303. Source electrode 309 is provided on a surface of first silicon carbide semiconductor layer 302. Source electrode 309 is electrically coupled to source region 304 and first contact region 305 through an ohmic contact. Therefore, first body region 303 is electrically coupled to source electrode 309 via first contact region 305.

First body region 303, source region 304, and first contact region 305 are formed through, for example, a process of injecting impurities into first silicon carbide semiconductor layer 302, and a high-temperature heat treatment (activating annealing) process through which the impurities injected into first silicon carbide semiconductor layer 302 are activated. Source electrode 309 can be formed, for example, by forming a layer made of a conductive material (e.g., Ni) on source region 304 and first contact region 305 in first silicon carbide semiconductor layer 302, and then performing a heat treatment at a high temperature.

Source region 304 and first silicon carbide semiconductor layer 302 are coupled via second silicon carbide semiconductor layer 306. Second silicon carbide semiconductor layer 306 is a 4H—SiC layer formed on first silicon carbide semiconductor layer 302 through epitaxial growth, for example, in which first conductivity type impurities are doped. A thickness of second silicon carbide semiconductor layer 306 may be 75 nm or thinner, and a doping concentration may be $1 \times 10^{18}$ cm$^{-3}$ or higher, for example. Second silicon carbide semiconductor layer 306 may not be provided on an FLR region of a termination region, described later.

Source region 304 and first contact region 305 respectively form an ohmic contact together with source electrode 309. If semiconductor device 2000 does not include second silicon carbide semiconductor layer 306, a transistor can be operated by applying a gate voltage to form an inversion layer to be served as a channel adjacent to a surface of first body region 303.

Gate insulating film 307 is, for example, a thermal oxide film ($SiO_2$ film) formed on a surface of second silicon carbide semiconductor layer 306 through thermal oxidation. Gate electrode 308 is made of conductive polysilicon, for example.

Interlayer dielectric film 311 lies on first silicon carbide semiconductor layer 302 or second silicon carbide semiconductor layer 306 to cover gate electrode 308 in active region 300A and termination region 300E, and gate insulating film 307 in termination region 300E, for example. Therefore, gate electrode 308 is covered by interlayer dielectric film 311.

Interlayer dielectric film 311 is formed with opening portions. Source electrode 309 in each of the unit cells is coupled in parallel to first surface electrode 312 (e.g., Al electrode) via each of the opening portions. First surface electrode 312 couples in parallel the source electrodes of the unit cells of a plurality of MISFETs formed in semiconductor device 2000.

Semiconductor device 2000 has a termination structure at termination region 300E. The termination structure includes, at termination region 300E, silicon carbide substrate 301 and first silicon carbide semiconductor layer 302. First silicon carbide semiconductor layer 302 lies on the main face of silicon carbide substrate 301. The termination structure is selectively formed on a surface of first silicon carbide semiconductor layer 302, and includes second body region 325 and second contact region 326. Second body region 325 is the second conductivity type, and surrounds active region 300A. Second contact region 326 is the second conductivity type, and is selectively formed on a surface of second body region 325. Similar to second body region 325, second contact region 326 also surrounds active region 300A. Second body region 325 may have an impurity concentration profile identical to an impurity concentration profile of first body region 303 in a depth direction. Similarly, second contact region 326 may have an impurity concentration profile identical to an impurity concentration profile of first contact region 305 in the depth direction. In other words, second body region 325 may be formed through a process identical to a process of forming first body region 303, and second contact region 326 may be formed through a process identical to a process of forming first contact region 305.

The termination structure may include pluralities of base electrodes (first base electrodes) 319a, base electrodes (second base electrodes) 319b, and base electrodes (second base electrodes) 319c. Base electrodes 319a, base electrodes 319b, and base electrodes 319c are formed on the surface of first silicon carbide semiconductor layer 302 so as to respectively come into contact with second contact region 326. Base electrodes 319a lie in an inner circumference (left in the figure) region, which is adjacent to active region 300A, of second contact region 326 in termination region 300E. Base electrodes 319a each are formed in an island manner, and are arranged similar to source electrode 309 in active region 300A, for example. On the other hand, base electrodes 319b and base electrodes 319c lie outside an outer periphery of gate electrode 308, described later, i.e., in an outer circumference (right in the figure) region of second contact region 326, to surround active region 300A. In other words, base electrodes 319b and base electrodes 319c each form annular shapes, when viewed in the direction perpendicular to the main face of silicon carbide substrate 301. A number of groups of base electrodes formed in the annular shape may be one, or three or more. Base electrodes 319a, base electrodes 319b, and base electrodes 319c are coupled to first surface electrode 312 via the opening portions of interlayer dielectric film 311.

In termination region 300E, second silicon carbide semiconductor layer 306 and gate insulating film 307 lie on first silicon carbide semiconductor layer 302. In termination region 300E, gate electrode 308 may also lie on gate insulating film 307 in order to provide upper gate electrodes. Gate electrode 308 is coupled to second surface electrode 313 (e.g., Al electrode) via the opening portion of interlayer dielectric film 311. Second surface electrode 313 takes a role of providing a gate signal to gate electrode 308 of each of the plurality of MISFETs. Second surface electrode 313 and first surface electrode 312 can be formed simultaneously by patterning a single conductive film.

The termination structure lies on the surface of first silicon carbide semiconductor layer 302, and includes at least one ring region 352 that is the second conductivity type in an FLR region surrounding second body region 325. Ring region 352 may have an impurity concentration profile identical to an impurity concentration profile of each of first body region 303 and second body region 325 in active region 300A in the depth direction.

In termination region 300E and active region 300A in semiconductor device 2000, passivation layer 314 is formed so as to protect an internal structure against an external environment. Passivation layer 314 is disposed on first surface electrode 312 and second surface electrode 313, and has first opening portions 314p from which parts of the surface electrodes are exposed. Regions of first surface electrode 312 and second surface electrode 313, which are exposed from passivation layer 314, are respectively regarded as source pad region SP and gate pad region GP. In this example, two first opening portions 314p for allowing first surface electrode 312 to be exposed are provided, and two source pad regions SP are formed.

In each of two source pad regions SP, first insulating layer 315 is disposed in each of two first opening portions 314p of passivation layer 314. First insulating layer 315 is disposed away from passivation layer 314, and has second opening portion 315p from which a part of first surface electrode 312 is exposed. Similarly, in gate pad region GP, second insulating layer 316 is disposed in another one of first opening portions 314p of passivation layer 314. Second insulating layer 316 is disposed away from passivation layer 314, and has second opening portion 316p from which a part of second surface electrode 313 is exposed.

As shown in FIG. 17B, in active region 300A and termination region 300E, passivation layer 314 may wholly cover first surface electrode 312 and second surface electrode 313, excluding source pad regions SP and gate pad region GP. A pad region is referred to as a region in which a wire, a ribbon, or a bus bar, for example, is coupled for coupling with a terminal of a package, as well as is a region in which a surface electrode is exposed. In this example, two source pad regions SP and one gate pad region GP are provided. A number and an arrangement of pad regions are not limited to the illustrated example.

As can be seen from FIG. 17A, when semiconductor device 2000 is viewed from above, parts of first surface electrode 312 are exposed in source pad regions SP. Each of the exposed portions of first surface electrode 312 includes first region 312a and second region 312b. First region 312a lies in one of the second opening portions of first insulating layer 315. Second region 312b lies between passivation layer 314 and first insulating layer 315. In other words, first surface electrode 312 is separated by first insulating layer 315 into two regions: first region 312a and second region 312b. First region 312a lies inside. Second region 312b lies outside.

Similarly, in gate pad region GP, a part of second surface electrode 313 is exposed. The exposed portion of second surface electrode 313 includes first region 313a and second region 313b. First region 313a lies in one of the second opening portions of second insulating layer 316. Second region 313b lies between passivation layer 314 and second insulating layer 316. In other words, second surface electrode 313 is separated by second insulating layer 316 into two regions: first region 313a and second region 313b. First region 313a lies inside. Second region 313b lies outside.

In this exemplary embodiment, similar to semiconductor device 1000, a probe or a wire is allowed to come into contact with first regions 312a and first region 313a respectively in order to provide source signals and gate signals. First regions 312a and first region 313a respectively lie in the second opening portions of insulating layer 115 in first surface electrode 312 and second surface electrode 313. Even if a probe or a wire moves in position and comes into contact with first and second insulating layers 315, 316, since passivation layer 314 and the insulating layers are separated, a negative effect to passivation layer 314 can thus be reduced, and decrease in long-term reliability can be suppressed.

Arrangements and configurations of source pad regions SP and gate pad region GP are not limited to the example shown in FIG. 17A.

FIGS. 18 to 21 are top views of semiconductor device 2010, semiconductor device 2011, semiconductor device 2020, and semiconductor device 2021, which are other semiconductor devices according to this exemplary embodiment.

Figure 18:
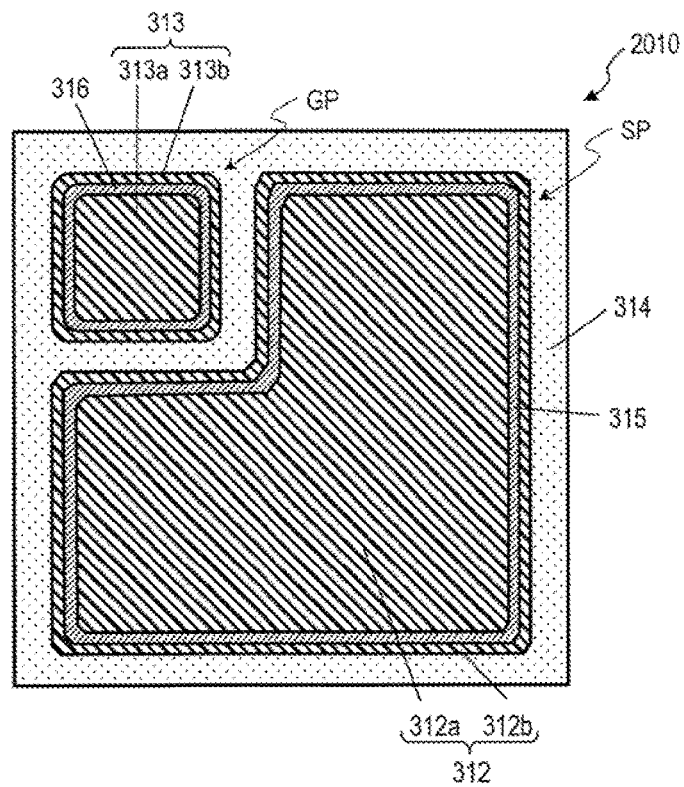
FIG. 18 is a top view schematically illustrating an example of semiconductor device 2010 that is another semiconductor device according to the second exemplary embodiment.

As shown in FIG. 18, one source pad region SP and one gate pad region GP may be provided.

Figure 19:
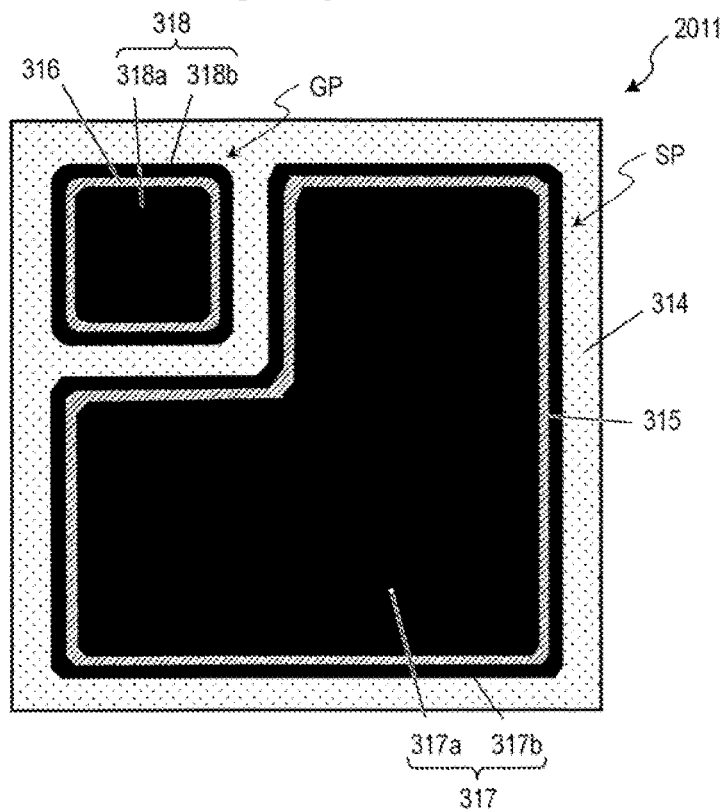
FIG. 19 is a top view schematically illustrating an example of semiconductor device 2011 that is still another semiconductor device according to the second exemplary embodiment.

As shown in FIG. 19, first metal layer 317 and second metal layer 318 may respectively be disposed on the exposed portions of first surface electrode 312 and second surface electrode 313 in semiconductor device 2010 shown in FIG. 18. In first metal layer 317, a portion lying on first region 312a is regarded as first portion 317a, and a portion lying on second region 312b is regarded as second portion 317b. In second metal layer 318, a portion lying on first region 313a is regarded as first portion 318a, and a portion lying on second region 313b is regarded as second portion 318b. First metal layer 317 and first metal layer 318 can be formed with a method identical to a method of forming metal layer 116 in the previously described exemplary embodiment. First metal layer 317 and first metal layer 318 may be formed before or after an inspection process.

Figure 20:
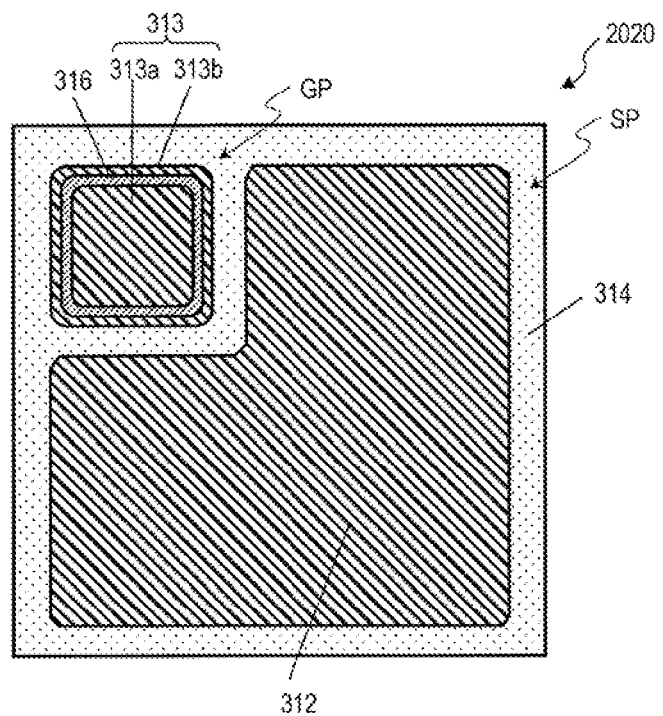
FIG. 20 is a top view schematically illustrating an example of semiconductor device 2020 that is still another semiconductor device according to the second exemplary embodiment.

In a semiconductor device having a plurality of surface electrodes, an insulating layer may be provided only on some of the plurality of surface electrodes. For example, when one of first surface electrode 312 and second surface electrode 313 is likely to crack, an insulating layer may be provided only to the one of the electrodes. As illustrated in FIG. 20, in gate pad region GP, second insulating layer 316 is disposed on second surface electrode 313, and, in source pad region SP, no insulating layer may be disposed on first surface electrode 312.

Figure 21:
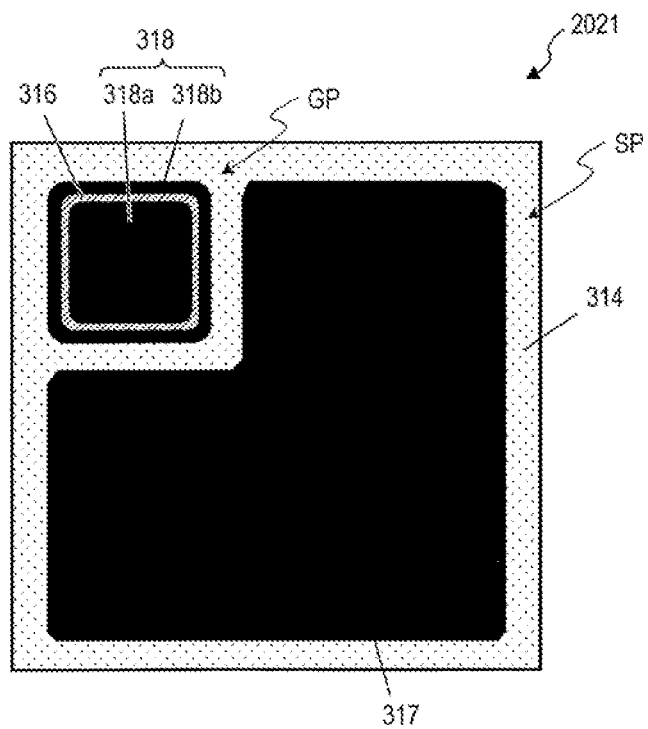
FIG. 21 is a top view schematically illustrating an example of semiconductor device 2021 that is still another semiconductor device according to the second exemplary embodiment.

Further, as illustrated in FIG. 21, in semiconductor device 2020 shown in FIG. 20, first metal layer 317 and first metal layer 318 may respectively be formed on the exposed portions of first surface electrode 312 and second surface electrode 313.

In the examples shown in FIGS. 20 and 21, the insulating layer is disposed on a gate pad side only. However, an insulating layer may be disposed on a source pad side only.

In an intelligent semiconductor device (specifically, a multi-function semiconductor device mounted with a temperature sensor or a current sensor), an electrode pad may be required to fetch signals, in addition to a gate pad and a source pad, and thus three or more surface electrodes may be disposed. In such a case, in each of all surface electrodes, an insulating layer may be disposed in an opening portion of a passivation layer, or an insulating layer may be disposed only on some of the surface electrodes.

The configurations of the semiconductor devices according to the present disclosure and materials of the components are not limited to the configurations and the materials of the above-described examples. The above exemplary embodiments have described a case when silicon carbide is 4H—SiC. However, silicon carbide may be another polytype, such as 6H—SiC, 3C—SiC, and 15R—SiC. The exemplary embodiments of the present disclosure have described a case when the main face of the SiC substrate is the face that is off-cut from a (0001) face. However, the main face of an SiC substrate may be a (11-20) face, a (1-100) face, a (000-1) face, an off-cut face of one of them, or another special plane orientation. Instead of silicon carbide substrate 301, an Si substrate may be used, and a 3C—SiC drift layer may be formed on the Si substrate.

A semiconductor device according to the present disclosure may be a semiconductor device using another semiconductor than silicon carbide. The other semiconductor may be, for example, another wide band gap semiconductor such as gallium nitride (GaN) or aluminum nitride (AlN), or may be a silicon semiconductor.

The above exemplary embodiments have described SBDs and MISFETs as semiconductor devices including surface electrodes. However, the configurations of the present disclosure can be applied to other semiconductor devices. In particular, the present disclosure can advantageously be applied to power elements to achieve a high breakdown voltage.

For example, in semiconductor device 2000 shown in FIGS. 17A and 17B, an insulated gate bipolar transistor (IGBT) can be formed by respectively specifying, for a substrate and a semiconductor layer (drift region) to be formed on the substrate, conductivity types that are different from each other. For the IGBT, a source electrode, a drain electrode, and a source region in a trench type MISFET described above are respectively referred to as an emitter electrode, a collector electrode, and an emitter region. An n-type channel IGBT can be obtained by specifying a conductivity type for a drift region and an emitter region to n-type, and a conductivity type for a substrate and a body region to p-type. A p-type channel IGBT can be obtained by specifying a conductivity type for a drift region and an emitter region to p-type, and a conductivity type for a substrate and a body region to n-type.

The present disclosure can be used for power semiconductor devices to be mounted on consumer power converters, on-board power converters, and power converters for industry machines, for example.

What is claimed is:

1. A semiconductor device comprising:
   a semiconductor having a predetermined element region;
   an electric field relaxation structure disposed on the semiconductor at an end of the element region;
   at least one surface electrode disposed on the semiconductor, the at least one surface electrode lying inside the electric field alleviation structure when viewed in a normal direction of the semiconductor;
   a passivation layer covering the electric field alleviation structure and a peripheral portion of the at least one surface electrode, the passivation layer having an opening portion above the at least one surface electrode; and
   an insulating layer disposed on the at least one surface electrode, and inside the opening portion so as to be separated from the passivation layer,
   wherein, when viewed in the normal direction of the semiconductor, the insulating layer is disposed so as to surround a partial region of the at least one surface electrode.

2. The semiconductor device according to claim 1, wherein the passivation layer and the insulating layer are made of a single material.

3. The semiconductor device according to claim 1, wherein the semiconductor device is a diode, and the at least one surface electrode includes at least either of a cathode and an anode.

4. The semiconductor device according to claim 1, wherein the semiconductor device is a transistor, and the at least one surface electrode includes at least either of a source and a drain.

5. The semiconductor device according to claim 1, wherein the semiconductor device is a transistor, and the at least one surface electrode includes at least either of an emitter and a collector.

6. The semiconductor device according to claim 1, wherein the semiconductor device is a transistor, and the at least one surface electrode includes a gate.

7. The semiconductor device according to claim 1, wherein the at least one surface electrode includes an electrode disposed outside a main current path.

8. The semiconductor device according to claim 1, further comprising a metal layer disposed on a region of the at least one surface electrode, the region being covered with neither the passivation layer nor the insulating layer.

9. The semiconductor device according to claim 8, wherein the at least one surface electrode includes, when viewed in the normal direction of the semiconductor:
   a first region surrounded by the insulating layer; and
   a second region lying between the passivation layer and the insulating layer, and
   wherein the metal layer includes:
   a first portion lying on the first region; and
   a second portion lying on the second region.

10. The semiconductor device according to claim 9, wherein the first portion and the second portion of the metal layer are separated from each other.

11. The semiconductor device according to claim 8, wherein the metal layer abuts a side face of the passivation layer and a side face of the insulating layer.

12. The semiconductor device according to claim 8, wherein the metal layer has hardness greater than hardness of the at least one surface electrode.

13. The semiconductor device according to claim 12, wherein the at least one surface electrode mainly contains aluminum, and the metal layer mainly contains nickel.

14. The semiconductor device according to claim 1, wherein the semiconductor contains silicon carbide.

15. The semiconductor device according to claim 1, wherein the electric field relaxation structure including a guard ring region and a field limiting ring region.

* * * * *